(12) United States Patent
Aiso

(10) Patent No.: US 12,805,251 B2
(45) Date of Patent: Nov. 17, 2026

US012805251B2

(54) SUBSTRATE PROCESSING APPARATUS, SUBSTRATE PROCESSING METHOD, AND METHOD FOR MANUFACTURING SEMICONDUCTOR DEVICE

(71) Applicant: Kioxia Corporation, Tokyo (JP)

(72) Inventor: Fumiki Aiso, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 534 days.

(21) Appl. No.: 18/460,759

(22) Filed: Sep. 5, 2023

(65) Prior Publication Data

US 2024/0096669 A1 Mar. 21, 2024

(30) Foreign Application Priority Data

Sep. 21, 2022 (JP) ................................ 2022-149740

(51) Int. Cl.
*H10P 72/10* (2026.01)
*C23C 16/455* (2006.01)
*C23C 16/458* (2006.01)

(52) U.S. Cl.
CPC ...... *H10P 72/127* (2026.01); *C23C 16/45546* (2013.01); *C23C 16/4586* (2013.01)

(58) Field of Classification Search
None
See application file for complete search history.

(56) References Cited

U.S. PATENT DOCUMENTS

| | | | | |
|---|---|---|---|---|
| 7,850,817 B2 * | 12/2010 | Wakabayashi | ........ B24B 37/345 | 156/345.12 |
| 8,366,872 B2 * | 2/2013 | Tsutsumi | ................ C23C 26/00 | 216/87 |
| 8,555,808 B2 * | 10/2013 | Yamamoto | ........ C23C 16/45542 | 118/723 E |
| 2007/0007646 A1 * | 1/2007 | Yamaguchi | ........... H10P 72/127 | 257/727 |
| 2007/0031222 A1 * | 2/2007 | Hosaka | ................. H10P 72/127 | 414/416.03 |
| 2010/0058982 A1 * | 3/2010 | Asari | .................. H10P 72/7602 | 118/500 |
| 2010/0154711 A1 | 6/2010 | Ishibashi et al. | | |

(Continued)

FOREIGN PATENT DOCUMENTS

| | | |
|---|---|---|
| CN | 102956531 A | 3/2013 |
| JP | 2010153467 A | 7/2010 |

(Continued)

*Primary Examiner* — Sylvia Macarthur
(74) *Attorney, Agent, or Firm* — Holtz, Holtz & Volek PC

(57) ABSTRACT

A substrate processing apparatus according to an embodiment includes a boat capable of accommodating a plurality of substrates taken out from a storage container, a reactor capable of housing the boat and processing the plurality of substrates, and first and second arms that transfer the plurality of substrates. The boat accommodates the substrates in a first direction intersecting surfaces of the substrates. The first arm holds both ends of one substrate in a second direction intersecting the first direction, and is capable of transferring the one substrate between the storage container and the second arm. The second arm has a first holder that can support two substrates in a third direction intersecting the first and second directions, and is capable of transferring the two substrates between the first arm and the boat.

16 Claims, 21 Drawing Sheets

(56) References Cited

U.S. PATENT DOCUMENTS

| | | | | |
|---|---|---|---|---|
| 2012/0180727 | A1* | 7/2012 | Hasegawa | C23C 16/45578 118/730 |
| 2013/0209212 | A1 | 8/2013 | Furuya et al. | |
| 2015/0000591 | A1* | 1/2015 | Kawasaki | H10P 72/1926 118/712 |
| 2018/0082875 | A1* | 3/2018 | Sasaki | H10P 72/0604 |
| 2019/0093219 | A1* | 3/2019 | Hayashi | C23C 16/4408 |
| 2024/0096669 | A1* | 3/2024 | Aiso | H10P 72/127 |

FOREIGN PATENT DOCUMENTS

| | | | |
|---|---|---|---|
| JP | 2011204945 | A | 10/2011 |
| JP | 2014067798 | A | 4/2014 |

* cited by examiner

SUBSTRATE PROCESSING APPARATUS, SUBSTRATE PROCESSING METHOD, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2022-149740, filed on Sep. 21, 2022; the entire contents of which are incorporated herein by reference.

FIELD

Embodiments described herein relate generally to a substrate processing apparatus, a substrate processing method, and a method for manufacturing a semiconductor device.

BACKGROUND

In a method for manufacturing a semiconductor device, for example, a plurality of substrates may be vertically arranged and accommodated in a reactor, such as a vertical furnace, to form a predetermined layer or the like. In order to improve productivity of the semiconductor device, it is desirable to increase the number of substrates that can be accommodated in the reactor.

DETAILED DESCRIPTION

In general, according to one embodiment, a substrate processing apparatus includes a boat capable of holding a plurality of substrates taken out from a storage container in a state arranged in a first direction intersecting surfaces of the plurality of substrates, a reactor capable of housing the boat and processing the plurality of substrates, and first and second arms that transfer the plurality of substrates. The first arm is capable of holding both ends of one substrate in a second direction intersecting the first direction, and is capable of transferring one substrate between the storage container and the second arm. The second arm has a first holder capable of supporting two substrates in a third direction intersecting the first and second directions, and is capable of transferring the two substrates between the first arm and the boat.

Exemplary embodiments of the present invention will be described below in detail with reference to the accompanying drawings. However, the present invention is not limited to the following embodiments. In addition, components in the following embodiments include those that can be easily assumed by those skilled in the art or those that are substantially the same.

(Configuration Example of Substrate Processing Apparatus)

Figure 1A:
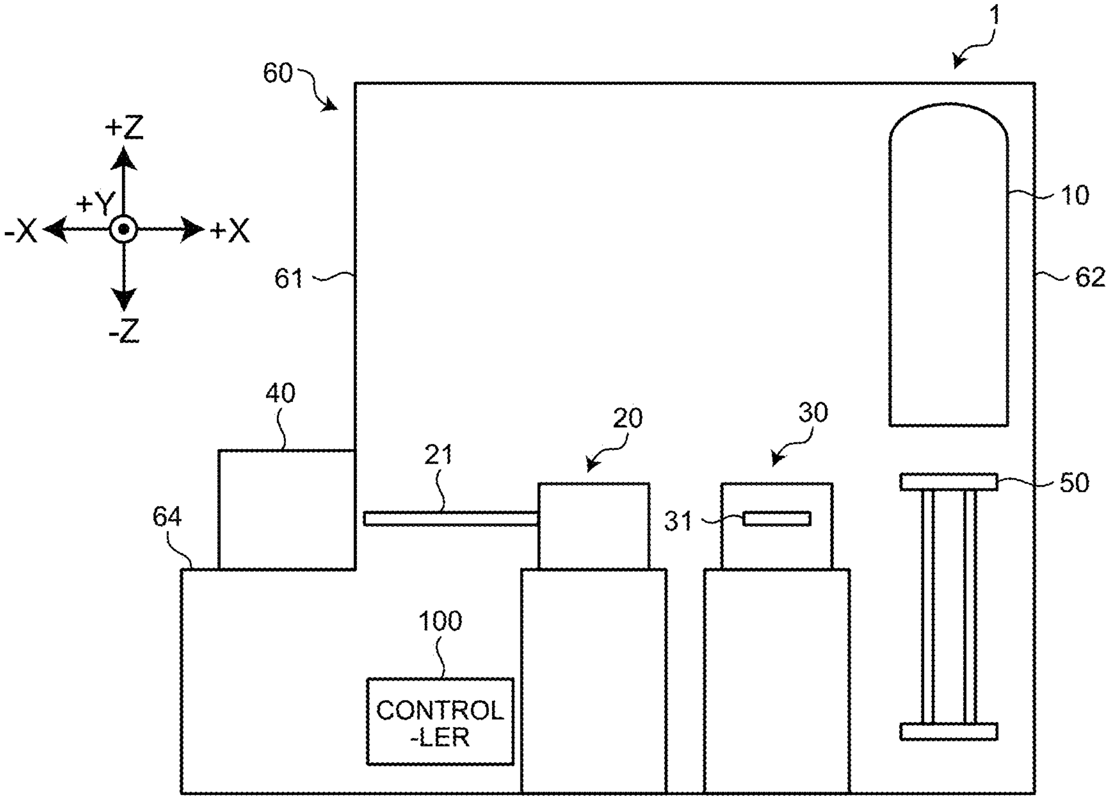
FIGS. 1A and 1B are schematic diagrams illustrating a configuration example of a substrate processing apparatus according to an embodiment.
Figure 1B:
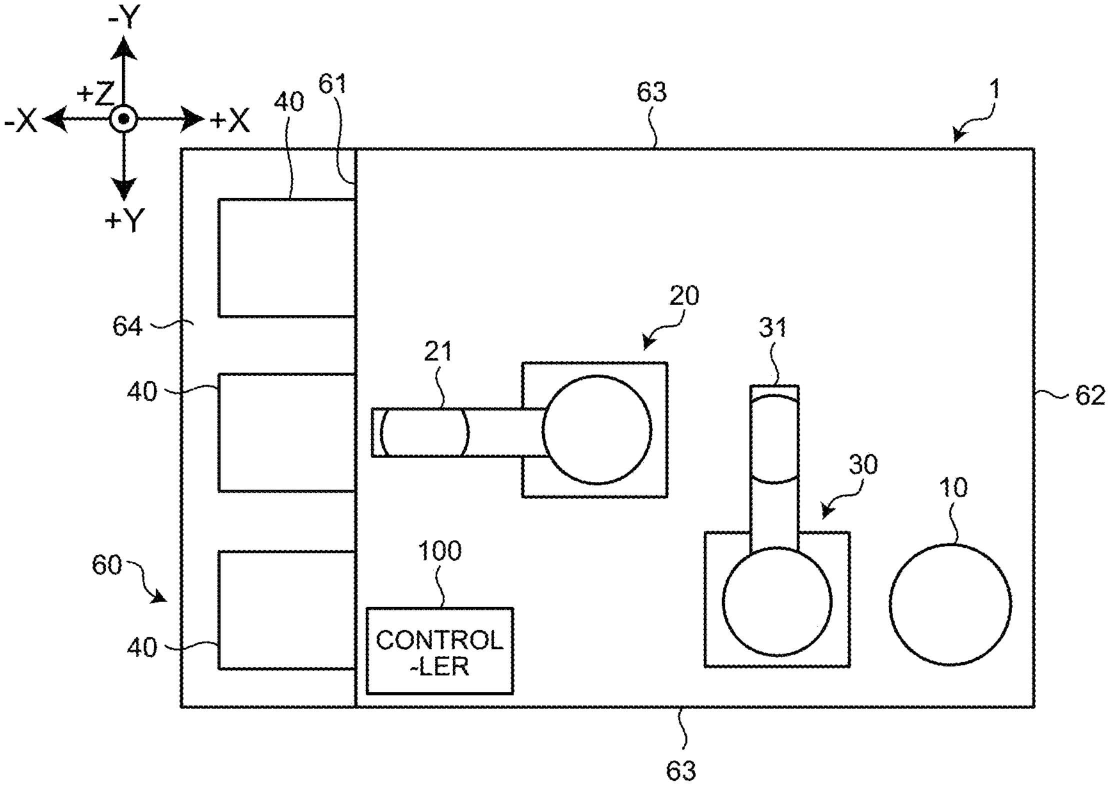

FIGS. 1A and 1B are schematic diagrams illustrating a configuration example of a substrate processing apparatus 1 according to an embodiment. FIG. 1A is a side perspective view of the substrate processing apparatus 1, and FIG. 1B is a top perspective view of the substrate processing apparatus 1.

As illustrated in FIGS. 1A and 1B, the substrate processing apparatus 1 according to the embodiment includes a reactor 10, transfer robots 20 and 30, a boat 50, a housing 60, and a controller 100. The reactor 10, the transfer robots 20 and 30, the boat 50, and the controller 100 are provided in the housing 60.

The housing 60 includes a front panel 61, a back panel 62, a side panel 63, and the like, and is configured to have an internal space surrounded therein. In the internal space of the housing 60, the reactor 10, the transfer robots 20 and 30, the boat 50, and the controller 100 are provided.

Here, in the present specification, a front-back direction of the substrate processing apparatus 1 is defined as an X direction, a left-right direction is defined as a Y direction, and an up-down direction is defined as a Z direction. More specifically, a front side of the substrate processing apparatus 1 is defined as a −X direction, and a rear side is defined as a +X direction. A right side facing the front of the substrate processing apparatus 1 is defined as a +Y direction, and a left side is defined as a −Y direction. An upper side of the substrate processing apparatus 1 is defined as a +Z direction, and a lower side is defined as a −Z direction. The X direction, the Y direction, and the Z direction are orthogonal to each other.

A storage container base 64 on which the storage container 40 can be disposed is provided in front of the housing 60. On the storage container base 64, one or more storage containers 40 may be placed. The storage container 40 is configured as, for example, a wafer cassette or a front opening unified pod (FOUP), and can store a plurality of substrates arranged in the vertical direction in a state that surfaces of the plurality of substrates are kept horizontal.

The reactor 10 is a tubular container whose upper end is closed and lower end is open, and is provided in a rear upper part in the housing 60. The reactor 10 is configured to be capable of housing the boat 50 accommodating the plurality of substrates, and performing processing such as formation of a predetermined layer on these substrates inside the reactor 10. Details of the reactor 10 and various configurations associated with the reactor 10 will be described later.

The boat 50 is disposed below the reactor 10 in a standby state. The boat 50 includes disk-shaped pressing members connected by a plurality of support pillars at upper and lower ends, and the pressing, and is configured to be capable of accommodating these substrates in the vertical direction in a state that the surfaces of the plurality of substrates are kept horizontal. The boat 50 is loaded into and unloaded from the reactor 10 from beneath the reactor 10 in a state that, for example, the plurality of substrates is accommodated.

The transfer robots 20 and 30 are provided in this order from the front of the housing 60, and transfer the plurality of substrates between the storage container 40 placed on the storage container base 64 in front of the housing 60 and the boat 50 at the back of the housing 60.

More specifically, the transfer robot 20 has an arm 21 to hold the substrate, and takes out the substrate from the storage container 40 and transfers the substrate to the transfer robot 30. The transfer robot 20 also holds, by the arm 21, the substrate transferred from the transfer robot 30 and places the substrate in the storage container 40.

The transfer robot 30 has an arm 31 to hold the substrate, and places the substrate transferred from the transfer robot 20 in the boat 50. The transfer robot 30 also takes out the substrate from the boat 50 and transfers the substrate to the transfer robot 20.

The transfer robot 20 that transfers a substrate W to and from the storage container 40 on the storage container base 64 is positioned, for example, closer to the storage container base 64 in the housing 60, i.e., closer to the −X direction. The transfer robot 30 that transfers the substrate W to and from the boat 50 is positioned, for example, closer to the boat 50 in the housing 60, i.e., closer to the +X direction.

The controller 100 is configured as a computer including, for example, a central processing unit (CPU), a read only memory (ROM), and a random access memory (RAM), and controls the entire substrate processing apparatus 1.

More specifically, the controller 100 controls, for example, the transfer robots 20 and 30 to transfer the substrates in the substrate processing apparatus 1. In addition, the controller 100 loads or unloads the boat 50 into or from the reactor 10. Still more, the controller 100 controls each unit associated with the reactor 10 to execute processing of the plurality of substrates in the reactor 10.

As described above, the controller 100 is accommodated, for example, at a predetermined position in the housing 60. However, the controller 100 may be provided outside the housing 60, or may be installed in a place away from the substrate processing apparatus 1 independent of other units of the substrate processing apparatus 1. In this case, the controller 100 can control each unit of the substrate processing apparatus 1 by remote control.

Arrangement positions of the reactor 10, the transfer robots 20 and 30, the boat 50, and the controller 100 in the housing 60 are not limited to the example illustrated in FIGS. 1A and 1B. Arrangement of the reactor 10, the transfer robots 20 and 30, the boat 50, and the controller 100 may be arbitrarily determined by a designer or the like of the substrate processing apparatus 1.

(Configuration Example of Reactor)

Figure 2:
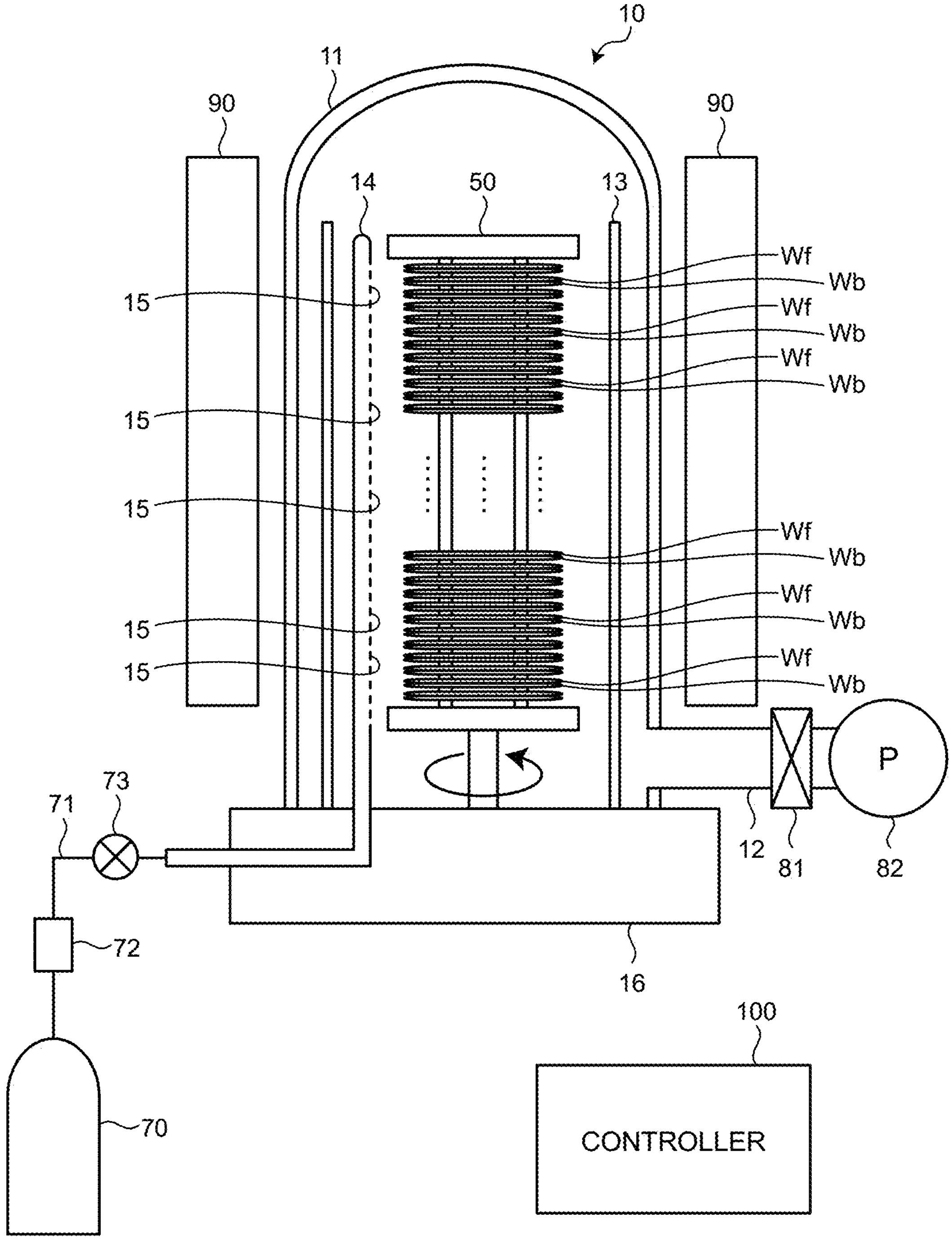
FIG. 2 is a schematic cross-sectional view illustrating an example of a configuration of a reactor according to the embodiment.

Next, the reactor 10 included in the substrate processing apparatus 1 and various configurations associated with the reactor 10 will be described with reference to FIG. 2. FIG. 2 is a schematic cross-sectional view illustrating an example of a configuration of the reactor 10 according to the embodiment. As illustrated in FIG. 2, the reactor 10 includes, for example, an outer tube 11 and an inner tube 13.

The outer tube 11 is a cylindrical tube made of, for example, quartz and extends in the vertical direction. An upper end of the outer tube 11 is closed, and a lower end is open. The open lower end of the outer tube 11 is placed on a base 16, and the outer tube 11 is configured to be capable of hermetically sealing inside. An exhaust port 12 is provided near the lower end of the outer tube 11.

A valve 81 and a pump 82 are provided on the exhaust port 12 of the outer tube 11. The valve 81 is disposed closer to the outer tube 11 on an upstream side with respect to the pump 82, and is a valve whose opening degree can be adjusted, such as a butterfly valve. By adjusting the opening degree of the valve 81 while driving the pump 82 on a downstream side of the valve 81, it is possible to exhaust an atmosphere in the outer tube 11 and adjust a pressure inside the outer tube 11 to a desired pressure.

The inner tube 13 is disposed inside the outer tube 11. The inner tube 13 is formed of, for example, quartz and is a cylindrical tube whose upper and lower ends are open. The open lower end of the inner tube 13 is installed on the base 16. The inner tube 13 is configured to be capable of housing a plurality of substrates W (Wf and Wb) to be subjected to a film forming process. The plurality of substrates W is substrates in the middle of manufacturing the semiconductor device, and a predetermined irregular pattern is formed on a front surface of each the substrates W by, for example, previous manufacturing processes.

The inner tube 13 houses the boat 50 that is made of, for example, quartz and capable of accommodating the plurality of substrates W. The plurality of substrates W can be accommodated in the boat 50 in parallel in an extending direction of the inner tube 13. In the plurality of substrates W, for example, two substrates Wf and Wb superposed with back surfaces facing each other are paired, and pairs are arranged in the boat 50 in the vertical direction at a predetermined interval.

In FIG. 2, the substrate Wb indicates the substrate W disposed in the boat 50 with the front surface facing downward and the back surface facing upward. The substrate Wf indicates the substrate W whose front surface faces upward and the back surface faces downward and is overlaid on the back surface of the paired substrate Wf.

As described above, the boat 50 is loaded into the inner tube 13 by a transfer system (not illustrated), and is configured to be rotatable in the inner tube 13 by a motor (not illustrated) or the like installed in the base 16.

A nozzle 14 is disposed inside the inner tube 13 at a position facing the exhaust port 12 of the outer tube 11 described above. The nozzle 14 extends from the upper end to the lower end of the inner tube 13, and has a shape in which the lower end is bent in an L shape. An L-shaped portion of the nozzle 14 is connected to a gas supply pipe 71 via, for example, the base 16 below the inner tube 13.

The nozzle 14 is configured as a porous nozzle having numerous holes 15 on a side surface in the extending direction of the nozzle 14. Each of a plurality of holes 41 of the nozzle 14 is arranged so as to correspond to a height position of each of the plurality of substrates W (Wf and Wb) accommodated in the boat 50.

An upstream end of the gas supply pipe 71 is connected to a gas cylinder 70 as a supply source of treatment gas for processing the substrates W, and a downstream end of the gas supply pipe 71 is connected to a lower end of the nozzle 14 as described above. The gas supply pipe 71 is provided with a mass flow controller 72 and a valve 73 in order from the upstream side.

The mass flow controller 72 adjusts a flow rate of the treatment gas flowing out of the gas cylinder 70. Supply of the treatment gas to the inner tube 13 is started or stopped by opening and closing the valve 73.

The treatment gas is a source gas or the like of the predetermined layer to be formed on the substrates W. The treatment gas is supplied to the substrates W in the inner tube 13 through the plurality of holes 15 of the nozzle 14, whereby the predetermined layer is formed on the substrates W. Examples of the predetermined layer formed on the substrates W are a silicon-based layer such as a Si layer, a $SiO_2$ layer, and a SiN layer, and a metal-containing layer such as an AlN layer and an $Al_2O_3$ layer.

A plurality of types of treatment gas may be used for forming the predetermined layer. For example, in order to form the silicon-based layer, a silane ($SiH_4$) gas or the like, which is a source gas of Si, is used together with an oxidizing gas or a nitriding gas. In addition, in order to form the AlN layer, the $Al_2O_3$ layer, and the like, a tri-methyl-aluminium (TMA) gas that is a source gas of Al, and an $N_2$ gas as the nitriding gas, an $O_2$ gas as the oxidizing gas, or the like are used.

Therefore, the substrate processing apparatus 1 may include a plurality of sets of the nozzle 14, the gas supply pipe 71, the mass flow controller 72, and the valve 73 for each of various types of gas that may be used in the substrate processing apparatus 1.

The treatment gas supplied from the nozzle 14 to the substrates W is discharged to outside of the inner tube 13 through a slit (not illustrated) provided on a side surface of the inner tube 13, i.e., the same side as the exhaust port 12 of the outer tube 11, and is discharged to outside of the substrate processing apparatus 1 through the exhaust port 12 of the outer tube 11.

A heater 90 is disposed outside the outer tube 11 so as to surround a side outer periphery of the outer tube 11. The heater 90 is, for example, a heater that heats the substrates W accommodated in the inner tube 13 to a desired temperature.

The controller 100 controls the valves 81 and 73, the pump 82, the mass flow controller 72, the heater 90, a transfer system (not illustrated), a motor (not illustrated) that rotates the boat 50, and the like.

More specifically, the controller 100 causes the transfer system (not illustrated) to load the boat 50 accommodating the plurality of substrates W stacked in multiple stages in the inner tube 13, and causes the motor (not illustrated) to rotate the boat 50 in the inner tube 13. In addition, the controller 100 controls the heater 90 to heat the substrates W in the inner tube 13 to the desired temperature.

Further, the controller 100 opens the valve 73 while controlling the flow rate by the mass flow controller 72, and supplies the treatment gas into the inner tube 13 through the nozzle 14. In addition, the controller 100 adjusts the opening degree of the valve 81 while driving the pump 82 to set the pressure in the outer tube 11 to a desired pressure.

As a result, the treatment gas is supplied to the front surface of each of the plurality of substrates W in a state where the plurality of substrates W accommodated in the inner tube 13 is heated to the desired temperature. In addition, when the treatment gas comes into contact with the front surface of each of the substrates W heated to the desired temperature, the treatment gas is decomposed by a thermochemical reaction. In addition, a component of the predetermined layer generated by decomposition of the treatment gas is deposited on the front surface of each of the substrates W in units of one to several atoms. Therefore, the predetermined layer is formed on the front surface of each of the plurality of substrates W.

As described above, the substrate processing apparatus 1 according to the embodiment is configured as, for example, the vertical furnace capable of forming the predetermined layer. More specifically, the substrate processing apparatus 1 is configured as an atomic layer deposition (ALD) apparatus that performs film formation, for example, by ALD in which the predetermined layer is formed in units of one to several atoms.

(Configuration Example of Transfer Robot)

Next, a configuration example of the transfer robots 20 and 30 included in the substrate processing apparatus 1 will be described with reference to FIGS. 3A to 3C.

Figure 3A:
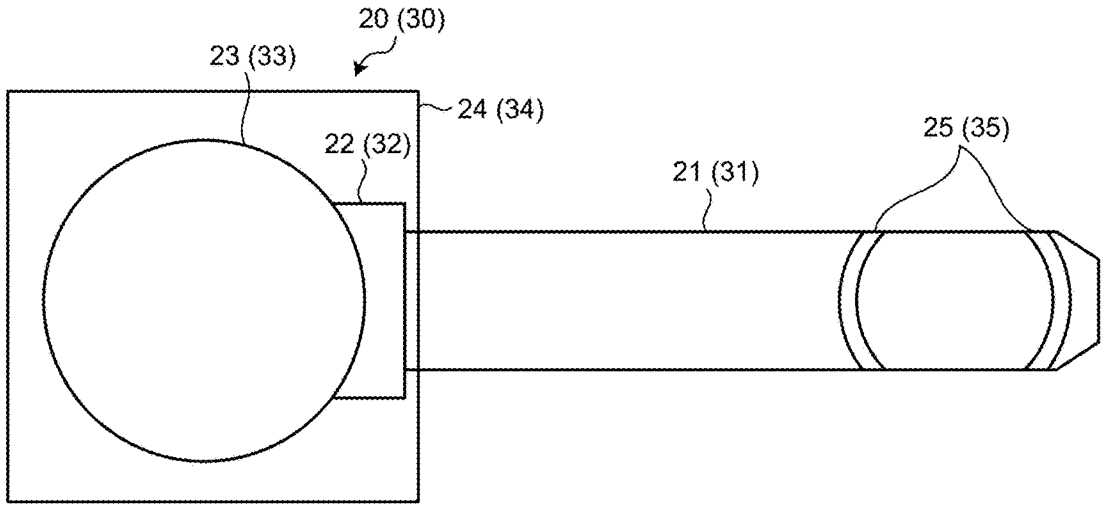
FIGS. 3A to 3C are schematic diagrams illustrating an example of a configuration of a transfer robot according to the embodiment.
Figure 3B:
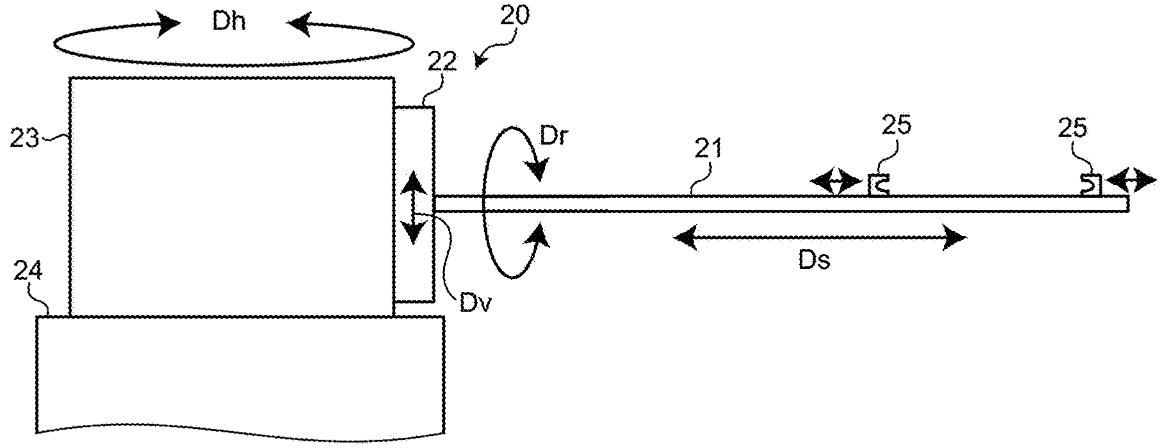
Figure 3C:
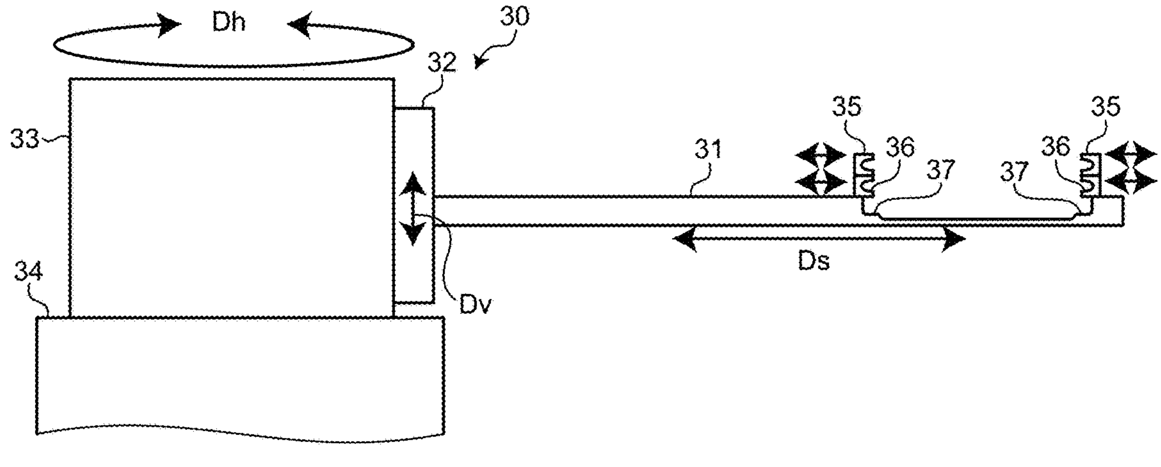

FIGS. 3A to 3C are schematic diagrams illustrating the configuration example of the transfer robots 20 and 30 according to the embodiment. FIG. 3A is a top view of the transfer robots 20 and 30, FIG. 3B is a side view of the transfer robot 20, and FIG. 3C is a side view of the transfer robot 30.

As illustrated in FIGS. 3A and 3B, the transfer robot 20 includes the arm 21, a base 22, a rotating unit 23, and a main body 24.

The main body 24 of the transfer robot 20 is installed, for example, on a floor surface of the housing 60 of the substrate processing apparatus 1. For example, the main body 24 of the transfer robot 20 may be configured to be movable on the floor surface of the housing 60 in the Y direction so as to face a substrate takeout port of the storage container 40 placed on the storage container base 64 of the substrate processing apparatus 1. Further, the main body 24 of the transfer robot 20 may be configured to be movable in the housing 60 between the storage container base 64 and the transfer robot 30.

The rotating unit 23 is provided, for example, on the main body 24 and is configured to be rotatable in a horizontal direction Dh by a motor (not illustrated) or the like. A tip portion of the arm 21 connected to the rotating unit 23 via the base 22 can be moved in the horizontal direction Dh by rotating the rotating unit 23 in the horizontal direction Dh. The base 22 is provided, for example, on a side surface of the rotating unit 23, and supports the arm 21 so as to be movable up and down in a vertical direction Dv and rotatable about an axis Dr by the motor (not illustrated) or the like.

The arm 21 as a first arm horizontally extends from the base 22, and is configured to be extendable and contractible in an extending direction Ds of the arm 21 by a motor (not illustrated) or the like. Holders 25 are provided on one side of the tip portion of the arm 21.

The holders 25 have a pair of arc-shaped portions facing each other, in a top view, in the extending direction Ds of the arm 21. Inner walls of these arc-shaped portions are, for example, curved and recessed inward.

Further, these arc-shaped portions can be opened and closed in the extending direction Ds of the arm 21 by a motor (not illustrated) or the like. In a state where these arc-shaped portions are opened, a distance between the closest portions facing each other of these arc-shaped portions is, for example, larger than a diameter of the substrate W. In addition, in a state where these arc-shaped portions are closed, a distance between the most recessed portions facing each other in the inner walls of these arc-shaped portions is, for example, substantially equal to the diameter of the substrate W.

By opening and closing the pair of arc-shaped portions as described above, the substrate W can be sandwiched and held at both ends in the extending direction Ds of the arm 21 between the curved inner walls of the holders 25. In addition, the substrate W held can be released.

Further, by rotating the arm 21 around the axis Dr by the base 22 in a state where the substrate W is held by the holder 25, front and back surfaces of the substrate W held by the arm 21 can be reversed.

Since the inner walls of the holders 25 are curved, the holders 25 are prevented from contacting the front surface of the substrate W when the substrate W is held by the holders 25.

As illustrated in FIGS. 3A and 3C, the transfer robot 30 includes an arm 31, a base 32, a rotating unit 33, and a main body 34.

The main body 34 of the transfer robot 30 is installed, for example, on the floor surface of the housing 60 of the substrate processing apparatus 1. Note that the main body 34 of the transfer robot 30 may be configured to be movable in the housing 60 between the transfer robot 20 and the boat 50 so that the substrate W can be transferred between the transfer robot 20 and the boat 50.

The rotating unit 33 is provided, for example, on the main body 34 and is configured to be rotatable in the horizontal direction Dh by a motor (not illustrated) or the like. By rotating the rotating unit 33 in the horizontal direction Dh, a tip portion of the arm 31 connected to the rotating unit 33 via the base 32 can be moved in the horizontal direction Dh. The base 32 is provided, for example, on a side surface of the rotating unit 33, and supports the arm 31 so as to be movable up and down in the vertical direction Dv by the motor (not illustrated) or the like.

The arm 31 as a second arm extends horizontally from the base 32 and is configured to be extendable and contractible in the extending direction Ds of the arm 31 by a motor (not illustrated) or the like. Holders 35 to 37 are provided on one side of a tip portion of the arm 31.

The holders 37 as a first holder have a stepped-recess shape from a surface of the arm 31. In other words, each of the holders 37 has a stepped portion having different depths from the surface of the arm 31. The depth from the surface of the arm 31 to the stepped portion is, for example, equal to or greater than a thickness of two substrates W. The stepped portions of the holders 37 are a pair of arc-shaped portions facing each other in the extending direction Ds of the arm 31. A distance between portions facing each other in these stepped portions is, for example, smaller than the diameter of the substrate W.

The substrate W is dropped into a recess from the surface of the arm 31 and is supported by the stepped portions of the holders 37. The holders 37 support the substrate W by these stepped portions to hold the substrate W. Since the depth from the surface of the arm 31 is, for example, equal to or greater than the thickness of two substrates W, two substrates W can be placed on the holders 37.

Note that the inner wall from the surface of the arm 31 to the stepped portion of the holder 37 preferably has a tapered shape in which the wall protrudes downward. In addition, a distance between the portions facing each other at the lower ends of these walls is, for example, preferably substantially equal to the diameter of the substrate W.

The holders 36 as a second holder have a pair of arc-shaped portions facing each other, in a top view, in the extending direction Ds of the arm 31. These arc-shaped portions are provided along an edge of the recess from the surface of the arm 31 to the holders 37. Inner walls of these arc-shaped portions are, for example, curved and recessed inward.

Further, these arc-shaped portions can be opened and closed in the extending direction Ds of the arm 31 by a motor (not illustrated) or the like. In a state where these arc-shaped portions are opened, a distance between the closest portions facing each other of these arc-shaped portions is, for example, larger than the diameter of the substrate W. In addition, in a state where these arc-shaped portions are closed, a distance between the most recessed portions facing each other in the inner walls of these arc-shaped portions is, for example, substantially equal to the diameter of the substrate W.

By opening and closing the pair of arc-shaped portions as described above, the substrate W can be sandwiched and held at both ends in the extending direction Ds of the arm 31 between the curved inner walls of the holders 36. In addition, the substrate W held can be released.

Since the inner walls of the holders 36 are curved, the holders 36 are prevented from contacting the front surface of the substrate W when the substrate W is held by the holders 36.

The holders 35 as a third holder are provided on an upper surface of the holders 36 and have a pair of arc-shaped portions facing each other, in a top view, in the extending direction Ds of the arm 31. Inner walls of these arc-shaped portions are, for example, curved and recessed inward.

Further, these arc-shaped portions can be opened and closed in the extending direction Ds of the arm 31 by a motor (not illustrated) or the like. In a state where these arc-shaped portions are opened, a distance between the closest portions facing each other of these arc-shaped portions is, for example, larger than the diameter of the substrate W. In addition, in a state where these arc-shaped portions are closed, a distance between the most recessed portions facing each other in the inner walls of these arc-shaped portions is, for example, substantially equal to the diameter of the substrate W.

By opening and closing the pair of arc-shaped portions as described above, the substrate W can be sandwiched and held at both ends in the extending direction Ds of the arm 31 between the curved inner walls of the holders 35. In addition, the substrate W held can be released.

Since the inner walls of the holders 35 are curved, the holders 35 are prevented from contacting the front surface of the substrate W when the substrate W is held by the holders 35.

The holders 35 and 36 can be opened and closed independently. As a result, the holders 35 and 36 can individually and independently hold the substrate W and release the substrate W held.

The controller 100 described above (see FIGS. 1A and 1B) controls these transfer robots 20 and 30 to transfer the substrates W between the storage container 40 installed on the storage container base 64 and the boat 50. More specifically, the controller 100 controls various motors and the like (not illustrated) included in the transfer robots 20 and 30 to rotate the rotating units 23 and 33 of the transfer robots 20 and 30 in the horizontal direction Dh, rotate the arm 21 around the axis Dr by the base 22, move up and down the arms 21 and 31 in the vertical direction Dv by the bases 22 and 32, and expand and contract the arms 21 and 31 in the extending direction Ds.

(Example of Loading Operation by Transfer Robot)

Next, an example of an operation in which the transfer robots 20 and 30 included in the substrate processing apparatus 1 transfer the substrates W from the storage container 40 to the boat 50, i.e., an operation of loading the substrates W by the transfer robots 20 and 30, will be described with reference to FIGS. 4A to 11Cb.

FIGS. 4A to 5Cb are schematic diagrams illustrating an example of an operation in which the transfer robot 20 according to the embodiment takes out a first substrate Wb of a pair of substrates Wf and Wb from the storage container 40.

Figure 4A:
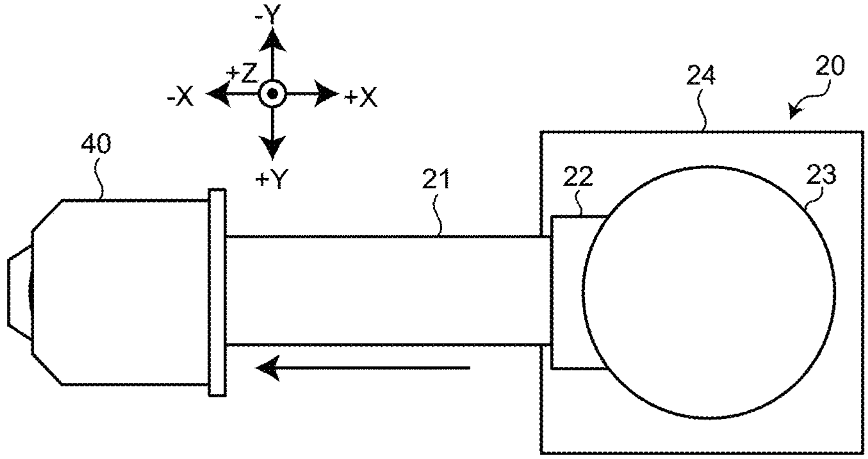
FIGS. 4A to 4Cb are schematic diagrams illustrating an example of an operation in which the transfer robot according to the embodiment takes out a first substrate of a pair of substrates from a storage container.
Figure 4B:
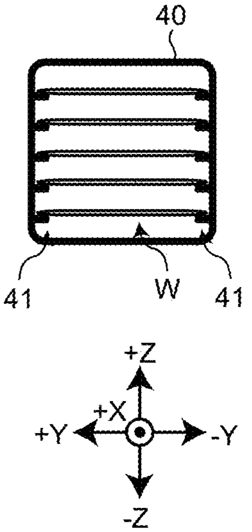
Figure 4B:
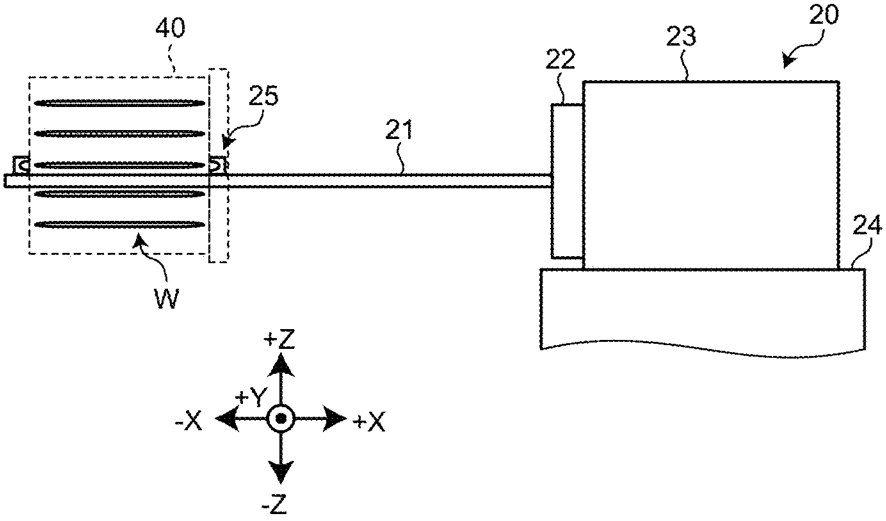
Figure 5A:
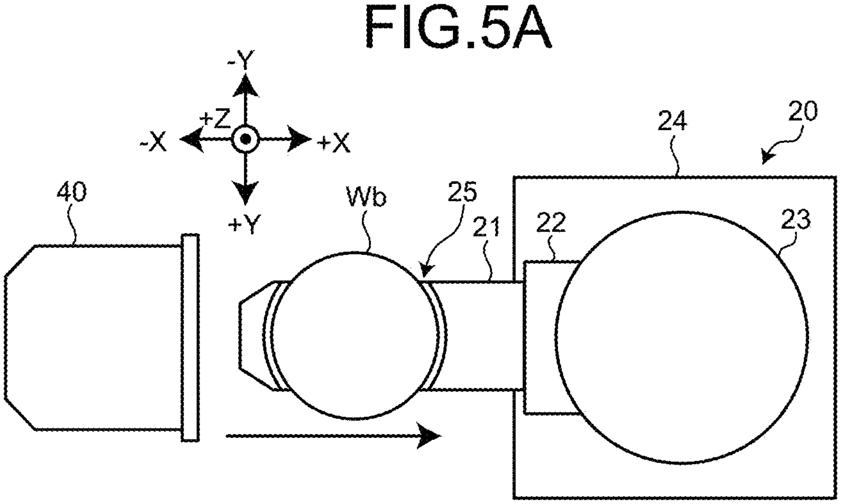
FIGS. 5A to 5Cb are schematic diagrams illustrating the example of the operation in which the transfer robot according to the embodiment takes out the first substrate of the pair of substrates from the storage container.

FIGS. 4A and 5A are top views of the storage container 40 and the transfer robot 20. FIGS. 4Ba, 4Ca, 5Ba, and 5Ca are front views of the storage container 40 seen from inside the housing 60 of the substrate processing apparatus 1 toward the front of the substrate processing apparatus 1.

FIGS. 4Bb, 4Cb, 5Bb, and 5Cb are side views of the storage container 40 and the transfer robot 20 seen from the +Y to −Y directions. However, in FIGS. 4Bb, 4Cb, 5Bb, and 5Cb, the storage container 40 is illustrated as a perspective view.

Figure 4C:
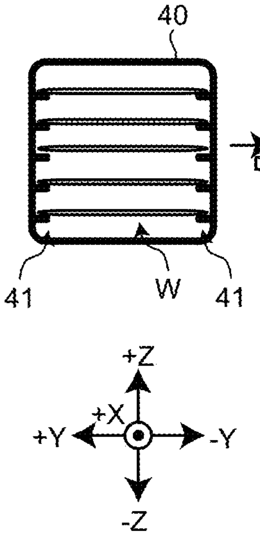
Figure 4C:
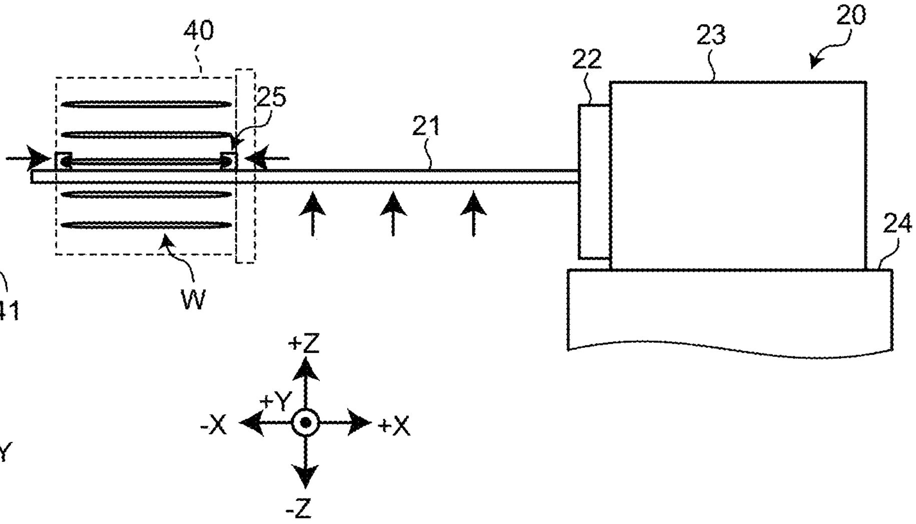

As illustrated in FIGS. 4A to 4Cb, the storage container 40 includes a space for storing the plurality of substrates W therein, and is configured to have a substantially rectangular parallelepiped shape. In a state of being placed on the storage container base 64 of the substrate processing apparatus 1, a plurality of shelves 41 arranged at an equal interval in the vertical direction is provided on inner walls of both side surfaces in the Y direction of the storage container 40. On both side surfaces in the Y direction, corresponding shelves 41 in the Y direction are arranged at the same height positions in the plurality of shelves 41.

The plurality of substrates W is arranged in the storage container 40 in the vertical direction at a predetermined interval from each other such that a pair of shelves 41 on both side surfaces of the storage container 40 supports the back surface of the substrate W at both ends in the Y direction of with the front surface directed upward. In other words, one substrate W is placed on the pair of shelves 41 arranged in the Y direction. Regardless of the example in FIGS. 4A to 4Cb, more than ten to several tens of substrates W can be housed in one storage container 40.

As illustrated in FIGS. 4A to 4Bb, the transfer robot 20 extends, for example, the arm 21 that has been contracted to insert the tip portion of the arm 21 between the substrates W adjacent in the vertical direction inside the storage container 40.

As illustrated in FIGS. 4Ca and 4Cb, the transfer robot 20 closes the holders 25 facing each other in the X direction to hold an upper substrate W of the substrates W adjacent in the vertical direction.

In addition, the transfer robot 20 raises the arm 21 by the base 22 to push up the substrate W held. As a result, the substrate W is lifted from the shelves 41 of the storage container 40 that has been supporting the substrate W.

Figure 5B:
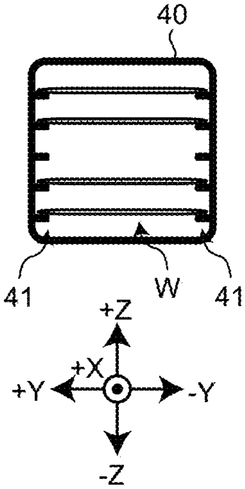
Figure 5B:
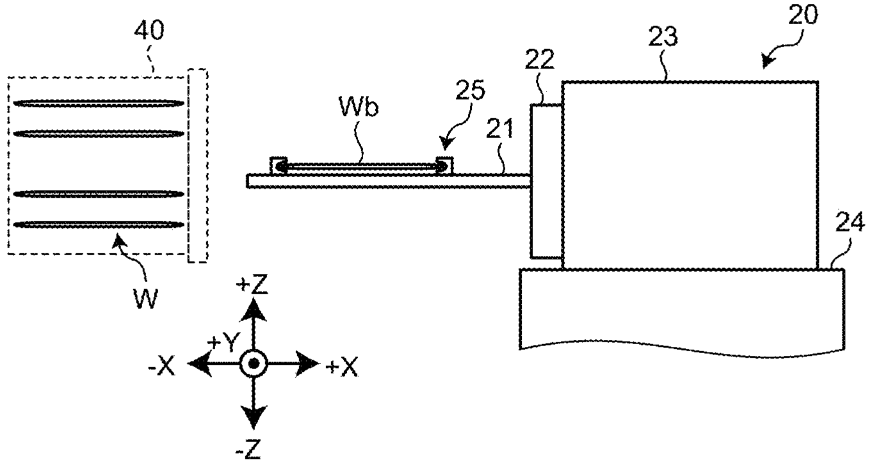

As illustrated in FIGS. 5A to 5Bb, the transfer robot 20 contracts the arm 21 to pull out the tip portion of the arm 21 from the storage container 40. As a result, the substrate W held by the holders 25 of the arm 21 is taken out from the storage container 40.

The substrate W taken out will be a first substrate Wb that is the first substrate of the pair of substrates Wf and Wb to be vertically superposed in the boat 50. When the first substrate Wb of the pair of substrates Wf and Wb is taken out from the storage container 40, as described above, the substrate Wb is held from the back surface of the substrate Wb at taking out the substrate Wb from the storage container 40.

Note that the plurality of substrates W housed in the storage container 40 is in the same manufacturing stage through the same manufacturing process, and similar to each other. Therefore, any substrates W among the plurality of substrates W may be the pair of substrates Wf and Wb according to a transfer order or the like.

For transfer of description, in the example in FIGS. 4A to 5Cb, one substrate W is taken out from the plurality of substrates W arranged in the vertical direction in the storage container 40. However, in a case where all the substrates W in the storage container 40 will be loaded, the substrates W stored in the storage container 40 are generally transferred in order, for example, from the lowermost to the uppermost positions in the storage container 40.

Figure 5C:
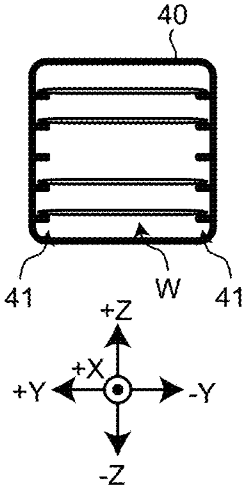
Figure 5C:
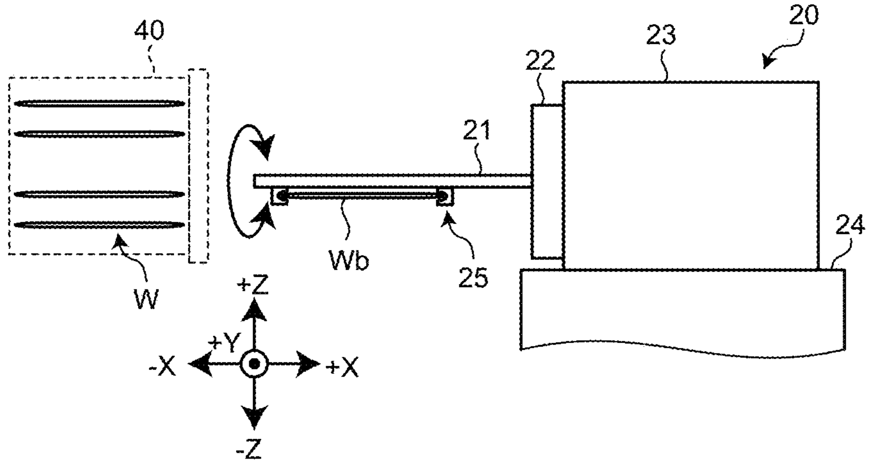

As illustrated in FIGS. 5Ca and 5Cb, the transfer robot 20 rotates the arm 21 around the axis by the base 22. As a result, the substrate Wb held by the arm 21 is reversed, so that the back surface is directed upward and the front surface is directed downward.

Note that the rotation around the axis of the arm 21 may be clockwise or counterclockwise. In addition, the front and back surfaces of the substrate Wb may be reversed at any timing after the substrate Wb is taken out from the storage container 40 until the substrate Wb is transferred to the transfer robot 30 described later.

Next, an operation example of transferring the substrate Wb from the transfer robot 20 to the transfer robot 30 will be described with reference to FIGS. 6A to 7Bb.

Figure 6A:
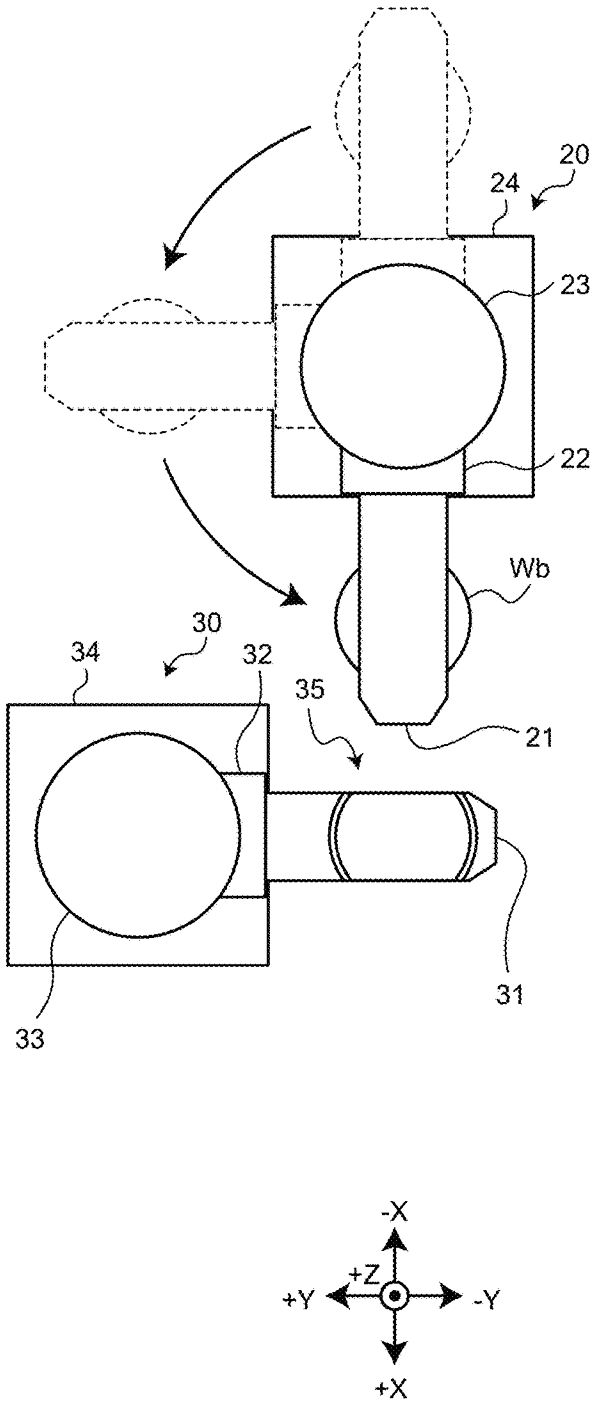
FIGS. 6A and 6B are schematic diagrams illustrating an example of an operation in which the transfer robot according to the embodiment transfers the first substrate of the pair of substrates toward the other transfer robot.
Figure 6B:
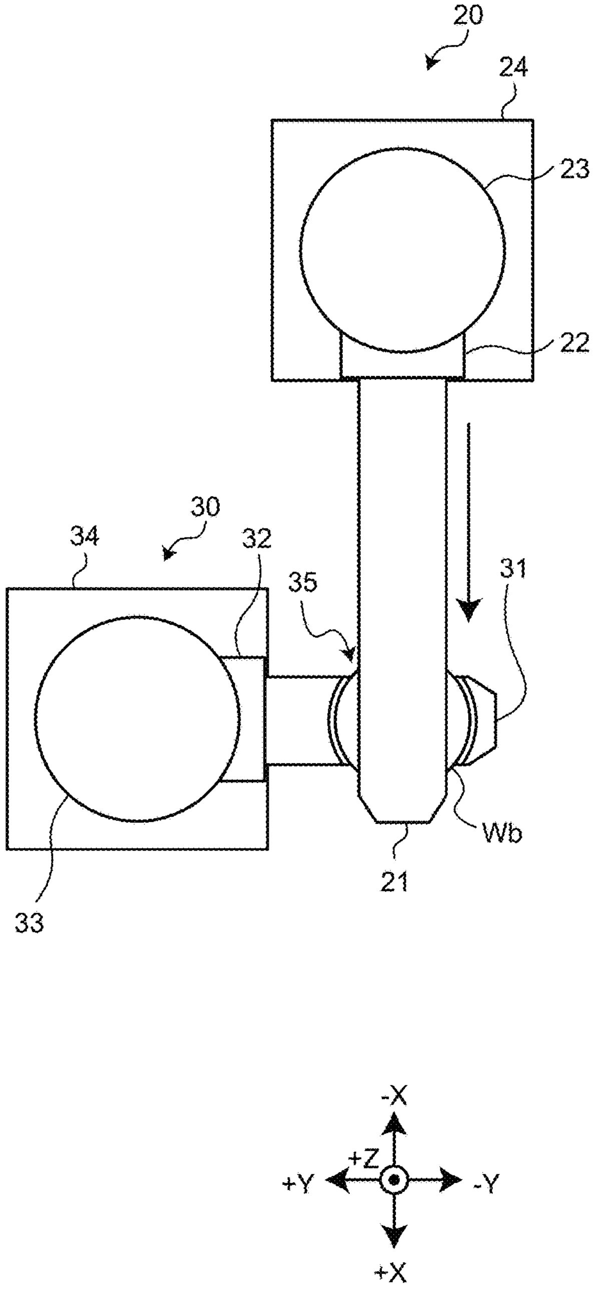

FIGS. 6A and 6B are schematic diagrams illustrating an example of an operation in which the transfer robot 20 according to the embodiment transfers the first substrate Wb of the pair of substrates Wf and Wb toward the other transfer robot 30. FIGS. 6A and 6B are top views of the transfer robots 20 and 30.

As illustrated in FIG. 6A, the transfer robot 30 stands by behind the transfer robot 20, i.e., on a side of the +X direction in a state that, for example, the arm 31 is contracted.

The transfer robot 20 rotates the rotating unit 23 in the horizontal direction to direct the arm 21, which has been directed toward the storage container base 64, toward the transfer robot 30. In other words, the tip portion of the arm 21 that has been directed in the −X direction is rotated 180° to be directed in the +X direction. Note that the rotating direction of the rotating unit 23 and the arm 21 may be clockwise or counterclockwise.

As illustrated in FIG. 6B, the transfer robot 20 extends the arm 21 in the +X direction. As a result, the tip portion of the arm 21 is extended above the tip portion of the arm 31 of the transfer robot 30.

To transfer the substrate W from the transfer robot 20 to the transfer robot 30, the positions of the arms 21 and 31 are controlled such that, as described above, the extending direction of the arm 21 of the transfer robot 20 intersects the extending direction of the arm 31 of the transfer robot 30.

Figure 7A:
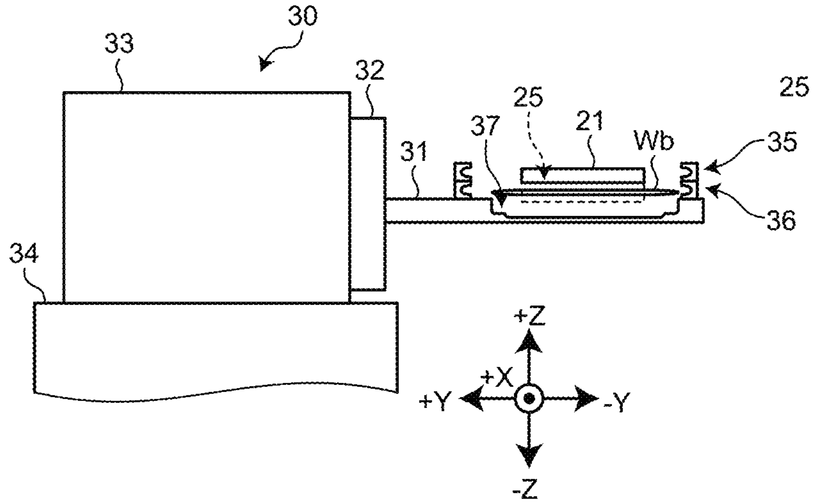
FIGS. 7Aa to 7Bb are schematic diagrams illustrating an example of an operation in which the transfer robot according to the embodiment transfers the first substrate of the pair of substrates to the other transfer robot.
Figure 7A:
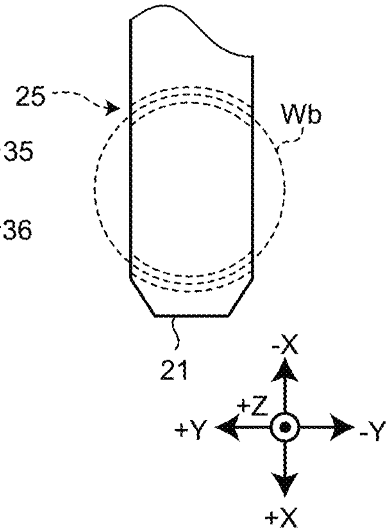

FIGS. 7Aa to 7Bb are schematic diagrams illustrating an example of an operation in which the transfer robot 20 according to the embodiment transfers the first substrate Wb of the pair of substrates Wf and Wb to the other transfer robot 30.

FIGS. 7Aa and 7Ba are side views of the transfer robot 30 seen from the inside of the housing 60 of the substrate processing apparatus 1 toward the front of the substrate processing apparatus 1. FIGS. 7Ab and 7Bb are top views of the arm 21 of the transfer robot 20 above the arm 31 of the transfer robot 30. However, in FIGS. 7Aa to 7Bb, a part of the arm 21 is illustrated as a perspective view.

As illustrated in FIGS. 7Aa and 7Ab, the tip portion of the arm 21 of the transfer robot 20 is positioned above the arm 31 of the transfer robot 30. The substrate Wb is held on a lower surface side of the tip portion of the arm 21. The front surface of the substrate Wb faces the arm 31 below in a state that both ends of the substrate Wb in the X direction are sandwiched by the holders 25 of the arm 21.

At this time, in the transfer robot 30, the holders 35 and 36 facing each other in the Y direction and provided on the arm 31 are opened. As a result, the upper surfaces of the stepped portions facing each other in the Y direction that configure the holders 37 of the arm 31 face the front surface of the substrate Wb positioned above the arm 31.

Figure 7B:
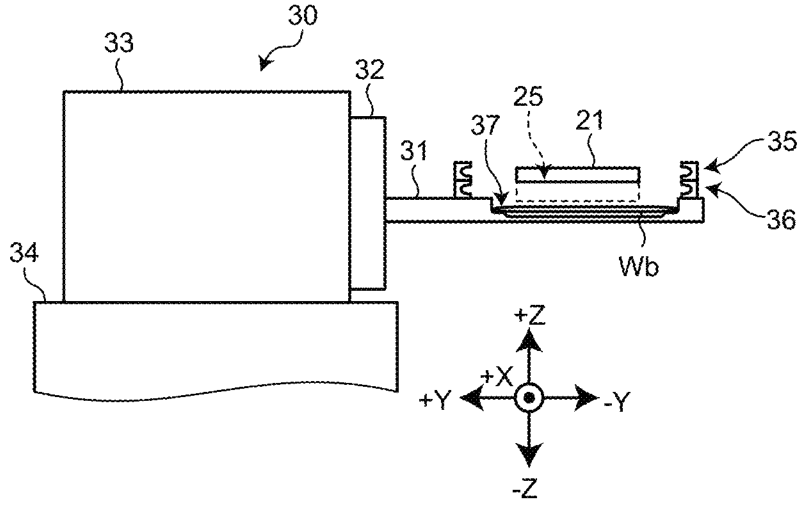
Figure 7B:
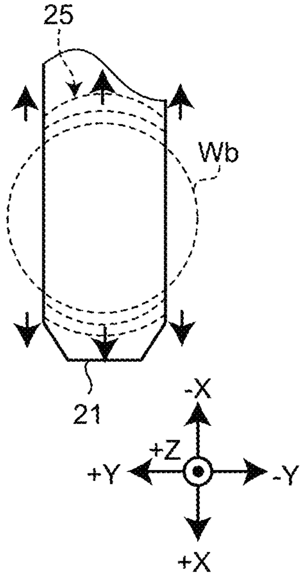

As illustrated in FIGS. 7Ba and 7Bb, the transfer robot 20 opens the holders 25 of the arm 21 facing each other in the X direction. As a result, the substrate Wb held by the holders 25 is released and dropped into the recess from the surface of the arm 31 of the transfer robot 30. Both ends in the Y direction of the substrate Wb dropped into the recessed of the arm 31 are supported by the stepped portions of the holders 37. As a result, the substrate Wb whose front surface is directed downward is held by the arm 31 of the transfer robot 30.

At this time, the ends of the front surface of the substrate Wb directed downward come into contact with the stepped portions of the holders 37. However, at the ends of the substrate Wb, an ineffective region that does not become a semiconductor device element exists in a ring shape with a predetermined width. Therefore, even when the ends of the front surface of the substrate Wb come into contact with the stepped portions of the holders 37, an influence on the semiconductor device, such as particles and contamination, can be suppressed.

In other words, the size of the holders 37 and the distance between the holders 37 facing each other in the Y direction are appropriately adjusted so that an effective region such as an element section of the substrate Wb does not come into contact with the stepped portions of the holders 37.

In addition, since the inner walls of the holders 37 are, for example, tapered as described above, the substrate W can be dropped into an appropriate position in the stepped portions of the holders 37. Therefore, the substrate W can be held more reliably although the holders 37 do not have a mechanism for sandwiching the substrate W, such as the holders 35 and 36.

To transfer the substrate W from the transfer robot 20 to the transfer robot 30, as described above, the arms 21 and 31 of the transfer robots 20 and 30 intersect each other in the extending directions.

As a result, the holders 25 and 37 of the transfer robots 20 and 30 also hold the substrate Wb at the ends in directions intersecting each other. In other words, at the time of transfer of the first substrate Wb, with reference to the front, back, left, and right directions of the substrate processing apparatus 1, both ends of the substrate Wb in the X direction are held by the holders 25 of the transfer robot 20, and both ends of the substrate Wb in the Y direction are held by the holders 37 of the transfer robot 30. As a result, the substrate Wb can be transferred between the transfer robots 20 and 30.

Thereafter, in order to take out a second substrate Wf from the storage container 40, the transfer robot 20 performs the above-described operation in FIGS. 6A and 6B in the opposite direction in a state that the substrate W is not held by the arm 21. In other words, the transfer robot 20 contracts the arm 21 located above the arm 31 of the transfer robot 30, and the arm 21 that has been directed in the +X direction is rotated 180°, by the rotating unit 23, to be directed in the −X direction.

Figure 8A:
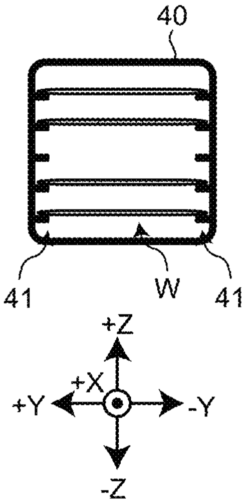
FIGS. 8Aa to 8Cb are schematic diagrams illustrating an example of an operation in which the transfer robot according to the embodiment takes out a second substrate of the pair of substrates from the storage container.
Figure 8A:
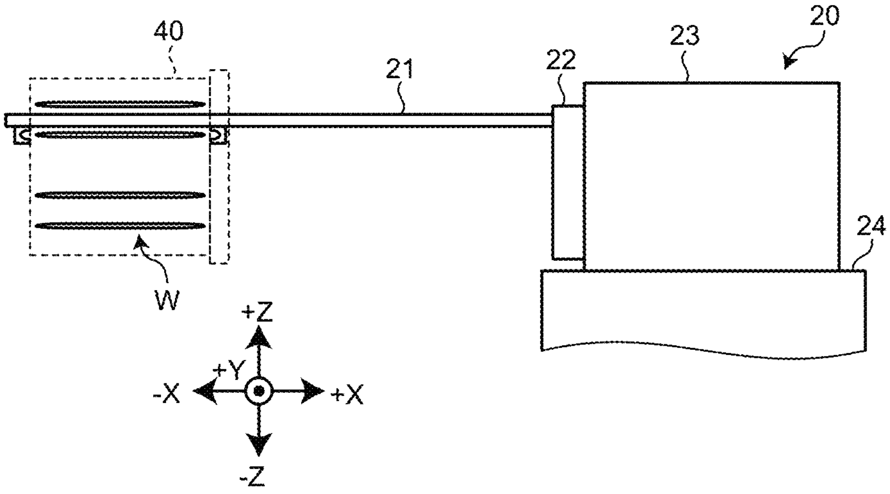

FIGS. 8Aa to 8Cb are schematic diagrams illustrating an example of an operation in which the transfer robot 20 according to the embodiment takes out the second substrate Wf of the pair of substrates Wf and Wb from the storage container 40.

FIGS. 8Aa, 8Ba, and 8Ca are front views of the storage container 40 seen from the inside of the housing 60 of the substrate processing apparatus 1 toward the front of the substrate processing apparatus 1. FIGS. 8Ab, 8Bb, and 8Cb are side views of the storage container 40 and the transfer robot 20 seen from the +Y to −Y directions. However, in FIGS. 8Ab, 8Bb, and 8Cb, the storage container 40 is illustrated as a perspective view.

As illustrated in FIGS. 8Aa and 8Ab, the transfer robot 20 extends, for example, the arm 21 that has been contracted, and inserts the tip portion of the arm 21 between the substrates W adjacent in the vertical direction of the storage container 40. At this time, the side of the arm 21 provided with the holders 25 faces downward.

Figure 8B:
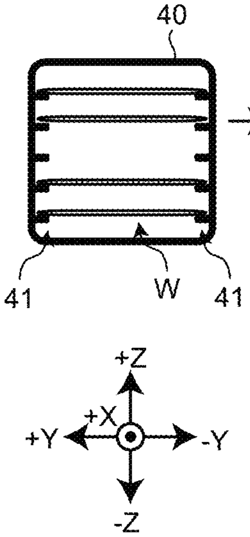
Figure 8B:
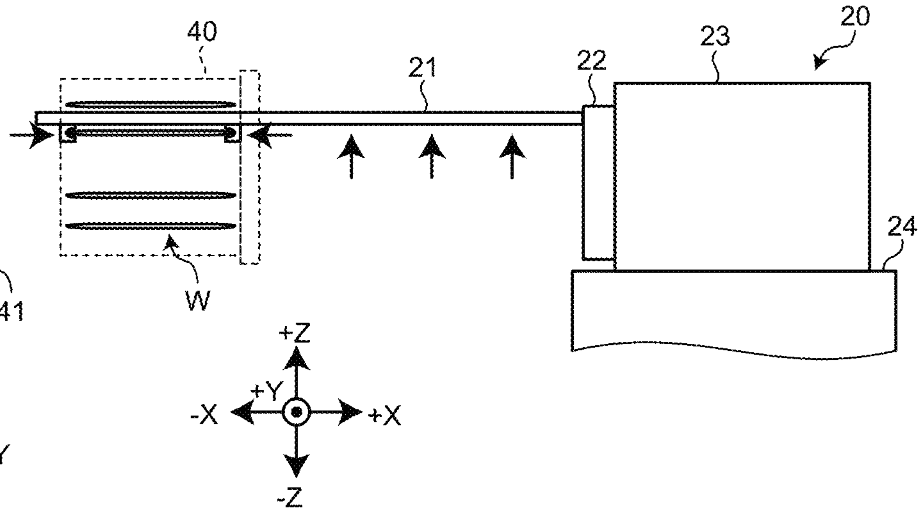

As illustrated in FIGS. 8Ba and 8Bb, the transfer robot 20 closes the holders 25 facing each other in the X direction to hold a lower substrate W of the substrates W adjacent in the vertical direction.

In addition, the transfer robot 20 raises the arm 21 by the base 22 to pull up the substrate W held. As a result, the substrate W is lifted from the shelves 41 of the storage container 40 that have been supporting the substrate W.

Figure 8C:
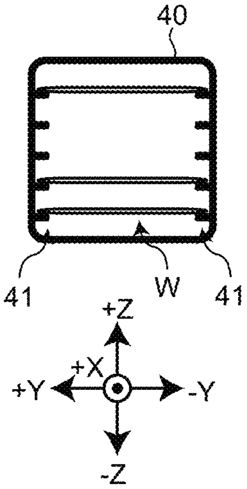
Figure 8C:
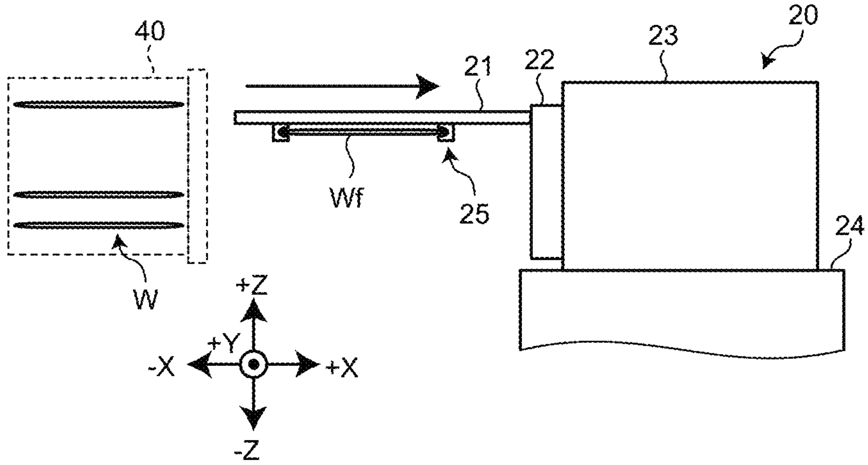

As illustrated in FIGS. 8Ca and 8Cb, the transfer robot 20 contracts the arm 21 to pull out the tip portion of the arm 21 from the storage container 40. As a result, the substrate W held by the holders 25 of the arm 21 is taken out from the storage container 40.

The substrate W taken out will be a second substrate Wf that is the second substrate of the pair of substrates Wf and Wb to be vertically superposed in the boat 50. When the second substrate Wf of the pair of substrates Wf and Wb is taken out from the storage container 40, as described above, the substrate Wf is held from the front surface of the substrate Wf at taking out the substrate Wf from the storage container 40.

As a result, the second substrate Wf whose front surface is directed upward to the arm 21 is held by the arm 21. Thereafter, the transfer robot 20 transfers the second substrate Wf of the pair of substrates Wf and Wb to the transfer robot 30 by the same operation as the operation illustrated in FIGS. 6A and 6B.

Figure 9A:
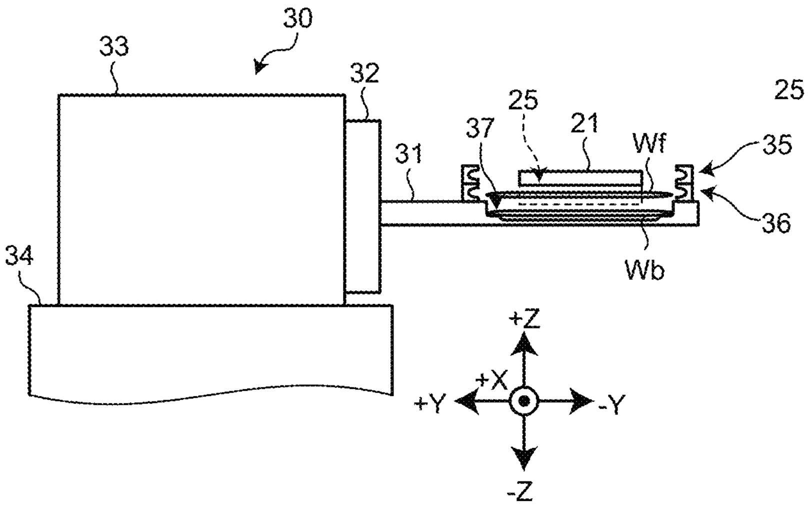
FIGS. 9Aa to 9Bb are schematic diagrams illustrating an example of an operation in which the transfer robot according to the embodiment transfers the second substrate of the pair of substrates to the other transfer robot.
Figure 9A:
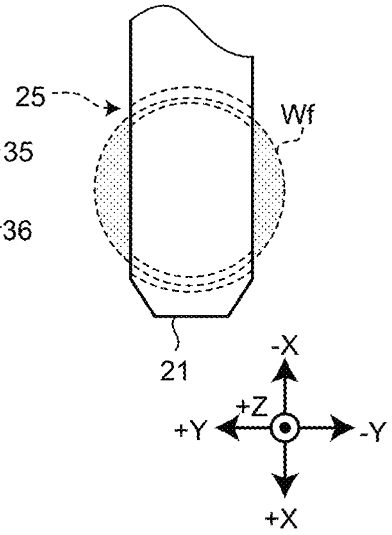

FIGS. 9Aa to 9Bb are schematic diagrams illustrating an example of an operation in which the transfer robot 20 according to the embodiment transfers the second substrate Wf of the pair of substrates Wf and Wb to the other transfer robot 30.

FIGS. 9Aa and 9Ba are side views of the transfer robot 30 seen from the inside of the housing 60 of the substrate processing apparatus 1 toward the front of the substrate processing apparatus 1. FIGS. 9Ab and 9Bb are top views of the arm 21 of the transfer robot 20 located above the arm 31 of the transfer robot 30. However, in FIGS. 9Aa to 9Bb, a part of the arm 21 is illustrated as a perspective view.

As illustrated in FIGS. 9Aa and 9Ab, the tip portion of the arm 21 of the transfer robot 20 is positioned above the arm 31 of the transfer robot 30. The substrate Wf is held on the lower surface side of the tip portion of the arm 21. The back surface of the substrate Wf faces the arm 31 below in a state that both ends of the substrate Wf in the X direction are sandwiched by the holders 25 of the arm 21.

Also at this time, the holders 35 and 36 facing each other in the Y direction are opened, and the upper surfaces of the stepped portions of the holders 37 facing each other in the Y direction face the back surface of the substrate Wf above the arm 31 via the substrate Wb held by the holders 37.

Figure 9B:
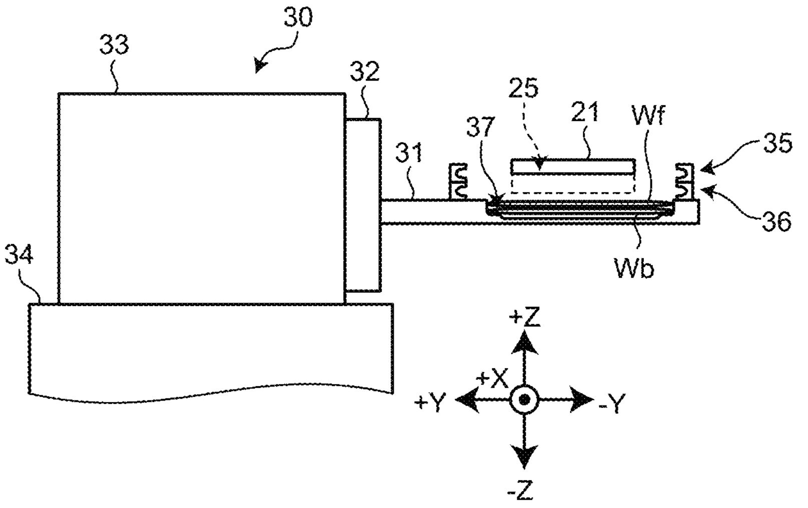
Figure 9B:
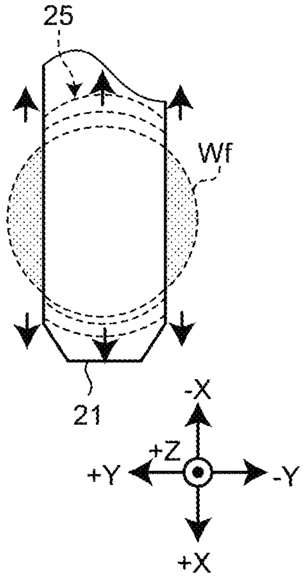

As illustrated in FIGS. 9Ba and 9Bb, the transfer robot 20 opens the holders 25 facing each other in the X direction of the arm 21 to release the substrate Wf. As a result, the substrate Wf is dropped into the recess from the surface of the arm 31 of the transfer robot 30 and overlaid on the back surface of the first substrate Wb held by the holders 37 of the arm 31. In other words, the second substrate Wf whose front surface is directed upward is held by the arm 31 in a state of being stacked on the substrate Wb with the back surfaces facing each other.

In this manner, the substrates Wf and Wb back surfaces face each other are stacked vertically. Therefore, the front surfaces of the substrates Wf and Wb on which the semiconductor device element will be formed do not come into contact with each other or with the arm 31. Thus, the influence, such as particles or contamination, on the semiconductor device is suppressed.

In addition, since the inner walls of the holders 37 are formed in the arc shape as described above, the substrate Wf dropped on the substrate Wb is suppressed from sideslip. Thus, the substrate Wf is more reliably held by the holders 37.

When the second substrate Wf is transferred, with reference to the front, rear, left, and right directions of the substrate processing apparatus 1, both ends of the substrate Wf in the X direction are held by the holders 25 of the transfer robot 20, and both ends of the substrate Wf in the Y direction are held by the holders 35 of the transfer robot 30. As a result, the substrate Wf can be transferred between the transfer robots 20 and 30.

Next, an operation example of accommodating the substrates Wf and Wb from the transfer robot 30 to the boat 50 will be described with reference to FIGS. 10A to 11Cb.

Figure 10A:
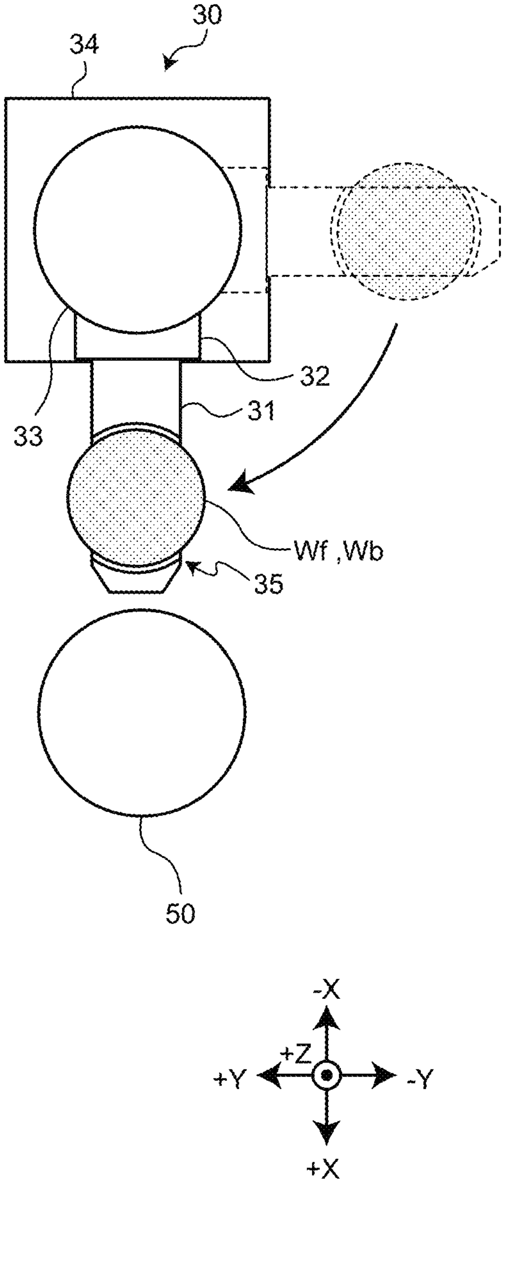
FIGS. 10A and 10B are schematic diagrams illustrating an example of an operation in which the transfer robot according to the embodiment transfers the pair of substrates toward a boat.
Figure 10B:
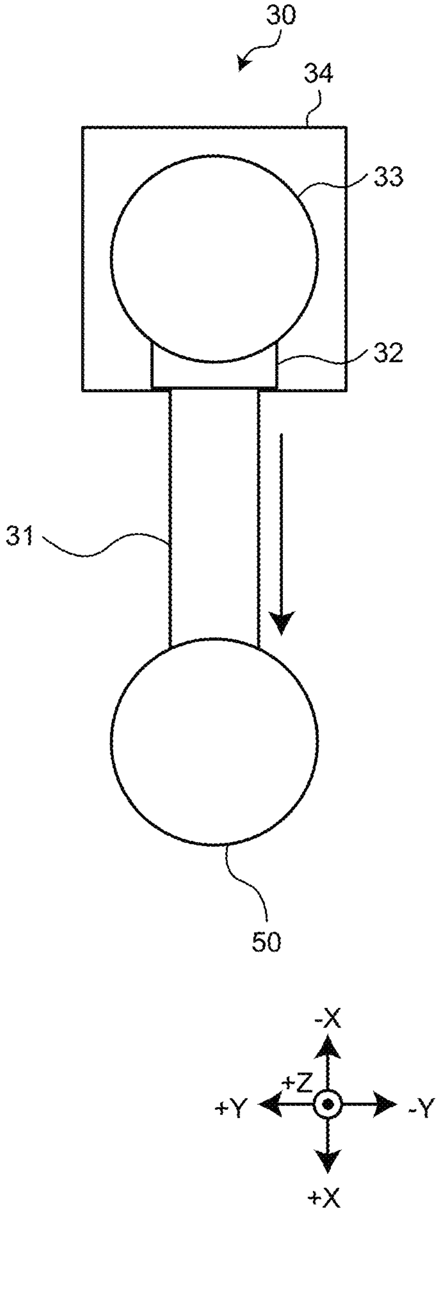

FIGS. 10A and 10B are schematic diagrams illustrating an example of an operation in which the transfer robot 30 according to the embodiment transfers the pair of substrates Wf and Wb to the boat 50. FIGS. 10A and 10B are top views of the transfer robot 30 and the boat 50.

As illustrated in FIG. 10A, the transfer robot 30 rotates the rotating unit 33 in the horizontal direction to direct the arm 31 toward the boat 50 from the direction of a transfer position of the substrates Wf and Wb from the transfer robot 20. In other words, the tip portion of the arm 31 that has been directed in the −Y direction is rotated 90° to be directed in the +X direction.

As illustrated in FIG. 10B, the transfer robot 30 extends the arm 31 in the +X direction. As a result, the tip portion of the arm 31 is inserted into the boat 50.

Figure 11A:
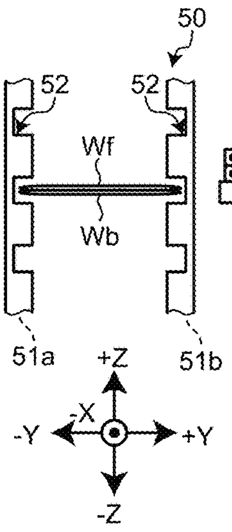
FIGS. 11Aa to 11Cb are schematic diagrams illustrating an example of an operation in which the transfer robot according to the embodiment places the pair of substrates in the boat.
Figure 11A:
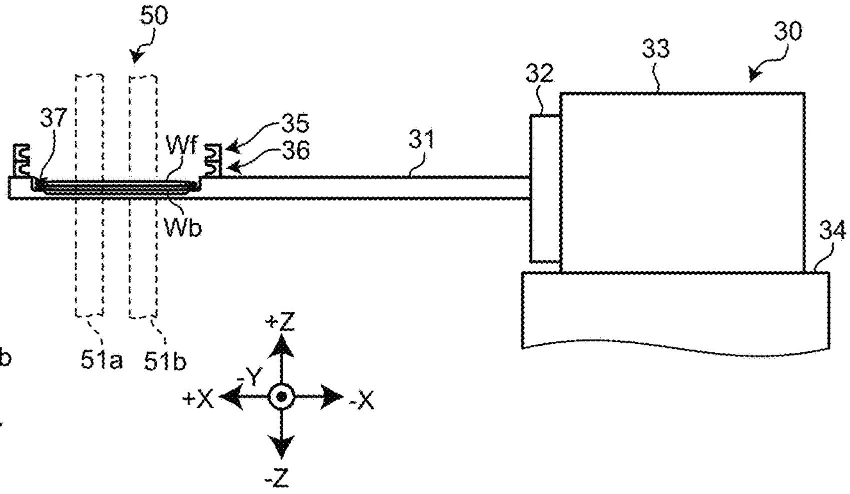

FIGS. 11Aa to 11Cb are schematic diagrams illustrating an example of the operation in which the transfer robot 30 according to the embodiment places the pair of substrates Wf and Wb in the boat 50.

FIGS. 11Aa, 11Ba, and 11Ca are front views of the boat 50 seen from the inside of the housing 60 of the substrate processing apparatus 1 toward the back of the substrate processing apparatus 1. FIGS. 11Ab, 11Bb, and 11Cb are side views of the boat 50 and the transfer robot 30 seen from the −Y to +Y directions. However, in FIGS. 11Ab, 11Bb, and 11Cb, the boat 50 is illustrated as a perspective view.

As described above, the boat 50 includes the disk-shaped pressing members connected by three to four supports at upper and lower ends. FIGS. 11Aa to 11Cb illustrate two support pillars 51*a* and 51*b* arranged in the Y direction among the plurality of support pillars of the boat 50.

As illustrated in FIGS. 11Aa to 11Cb, the plurality of support pillars including support pillars 51*a* and 51*b* is provided with a plurality of claws 52 arranged at an equal interval in the vertical direction. The claws 52 are formed, for example, by providing grooves at an equal interval on a side surface of a cylindrical support pillar. In the support pillars 51*a* and 51*b* arranged in the Y direction, corresponding claws 52 in the Y direction are arranged at the same height positions in the plurality of claws 52.

The plurality of substrates W is accommodated in the boat 50 arranged in the vertical direction at a predetermined interval therebetween in a state that the substrates Wf and Wb are stacked in the vertical direction as one pair and both ends in the Y direction are respectively supported by a pair of claws 52 on side surfaces of the support pillars 51*a* and 51*b*. In other words, the two substrates Wf and Wb are placed on the pair of claws 52 arranged in the Y direction by overlaying the substrate Wf whose front surface faces upward on the back surface of the substrate Wb whose front surface faces downward.

As illustrated in FIGS. 11Aa and 11Ab, the tip portion of the arm 31 of the transfer robot 30 is inserted into the boat 50 by the operation in FIGS. 10A and 10B. The tip portion of the arm 31 holding the two substrates Wf and Wb is positioned slightly above the pair of claws 52 in the boat 50. In other words, the transfer robot 30 inserts the arm 31 above the pair of claws 52 that will support the substrates Wf and Wb.

Figure 11B:
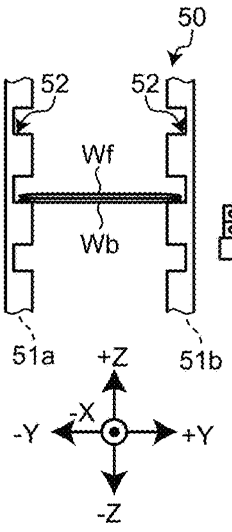
Figure 11B:
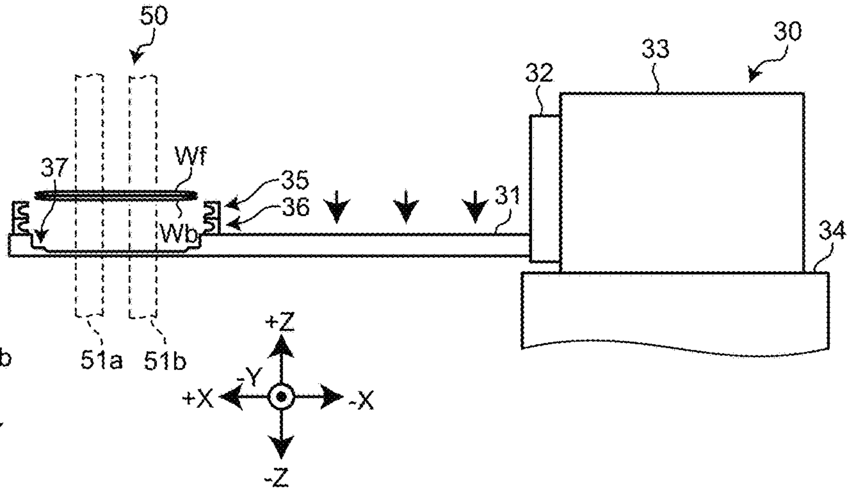

As illustrated in FIGS. 11Ba and 11Bb, the transfer robot 30 lowers the arm 31 by the base 32. As a result, both ends of the substrates Wf and Wb in the Y direction are supported by the pair of claws 52, and are lifted from the holders 37 of the arm 31.

Figure 11C:
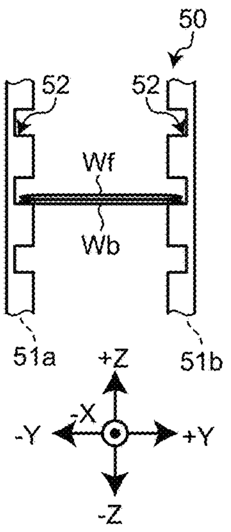
Figure 11C:
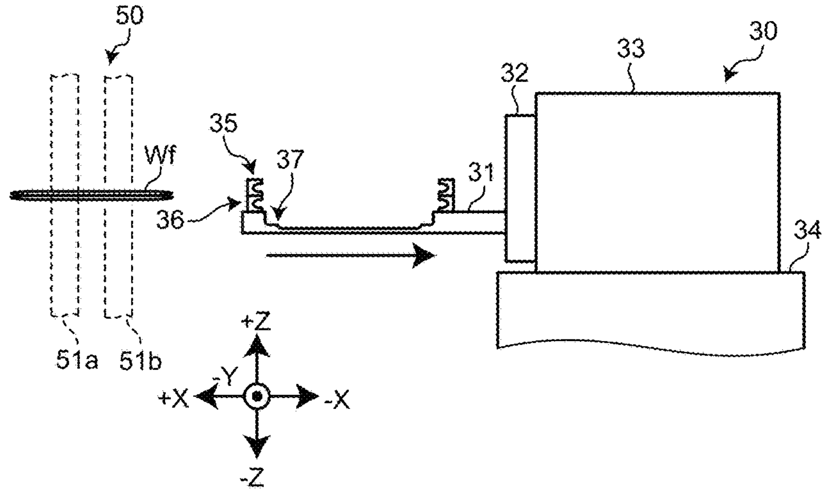

As illustrated in FIGS. 11Ca and 11Cb, the transfer robot 30 contracts the arm 31. As a result, the arm 31 is pulled out from the boat 50, and the two substrates Wf and Wb are accommodated at predetermined positions in the boat 50.

For transfer of description, in the example in FIGS. 11Aa to 11Cb, the substrates Wf and Wb are accommodated in the pair of claws 51 among the empty slots arranged in the vertical direction in the boat 50, i.e., the claws 51 not supporting the substrates W. However, when a plurality of pairs of substrates Wf and Wb is accommodated in the boat 50, the substrates W sequentially transferred from the transfer robot 20 are generally loaded, for example, in order from the uppermost to the lowermost positions in the boat 50.

Thus, the loading operation of the pair of substrates Wf and Wb by the transfer robots 20 and 30 ends.

Thereafter, the transfer robots 20 and 30 repeat the above-described loading operation to accommodate the plurality of substrates W in the boat 50. When substrate processing is performed in the reactor 10, it is preferable that the maximum number of substrates W that can be accommodated is loaded in the boat 50. In a state that the maximum number of substrates W is loaded in the boat 50, for example, each of all of the plurality of claws 52 provided in the boat 50 supports one pair of substrates Wf and Wb.

Note that, for example, several lots of substrates W can be accommodated in the boat 50 when one lot of substrates W is housed in in one storage container 40. Therefore, as illustrated in FIGS. 1A and 1B described above, the plurality of storage containers 40 may be configured to be placed on the storage container base 64 of the substrate processing apparatus 1, and a desired number of substrates W may be loaded into the boat 50 continuously from these storage containers 40.

(Example of Unloading Operation by Transfer Robot)

Next, an example of an operation in which the transfer robots 20 and 30 included in the substrate processing apparatus 1 take out the substrates W from the boat 50 to the storage container 40, i.e., an unloading operation of the substrates W by the transfer robots 20 and 30, will be described with reference to FIGS. 12Aa to 18Cb.

Figure 12A:
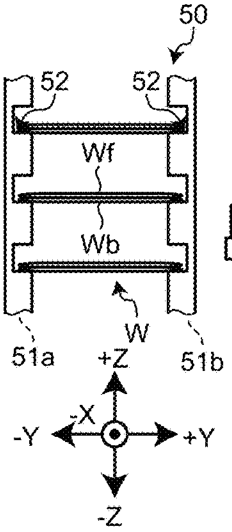
FIGS. 12Aa to 12Cb are schematic diagrams illustrating an example of an operation in which the transfer robot according to the embodiment takes out the pair of substrates from the boat.
Figure 12A:
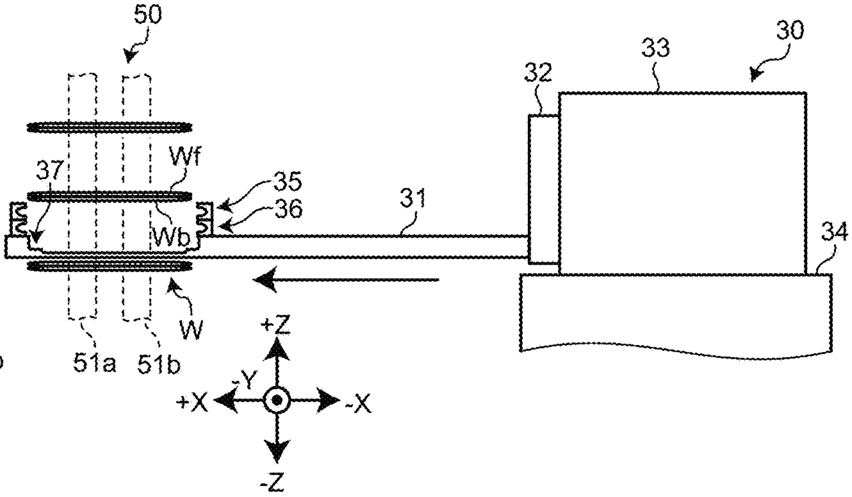

FIGS. 12Aa to 13Bb are schematic diagrams illustrating an example of an operation in which the transfer robot 30 according to the embodiment takes out the pair of substrates Wf and Wb from the boat 50.

FIGS. 12Aa, 12Ba, 12Ca, 13Aa, and 13Ba are front views of the boat 50 seen from the inside of the housing 60 of the substrate processing apparatus 1 to the back of the substrate processing apparatus 1. FIGS. 12Ab, 12Bb, 12Cb, 13Ab, and 13Bb are side views of the boat 50 and the transfer robot 30 seen from the −Y to +Y directions. However, in FIGS. 12Ab, 12Bb, 12Cb, 13Ab, and 13Bb, the boat 50 is illustrated as a perspective view.

As illustrated in FIGS. 12Aa and 12Ab, the transfer robot 30 extends, for example, the arm 31 that has been contracted, and inserts the tip portion of the arm 31 between the two pairs of substrates Wf and Wb adjacent in the vertical direction in the boat 50. At this time, both holders 35 and 36 of the arm 31 are opened.

Figure 12B:
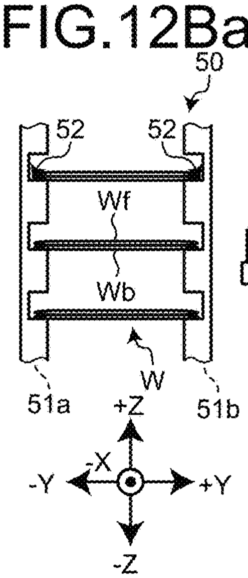
Figure 12B:
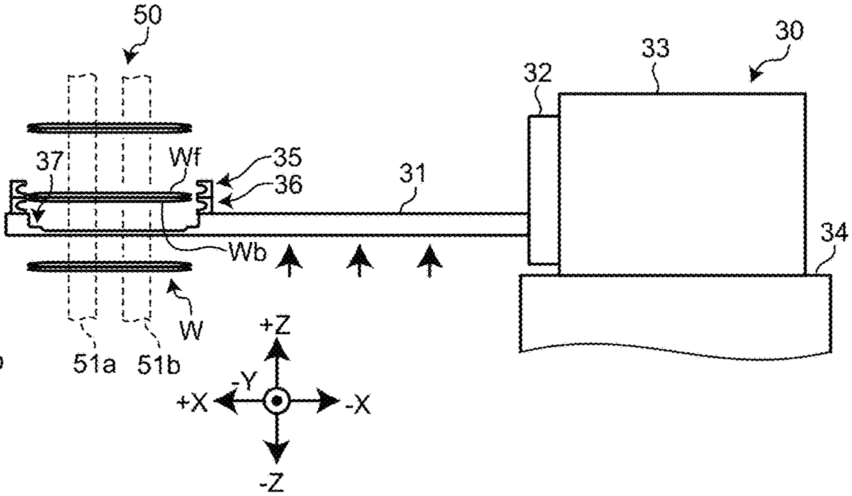

As illustrated in FIGS. 12Ba and 12Bb, the transfer robot 30 raises the arm 31 by the base 32. As a result, the lower ends of the upper holders 35 of the holders 35 and 36 of the arm 31 are located at substantially the same height as the height of the back surface of the upper substrate Wf of the substrates Wf and Wb to be transferred.

Figure 12C:
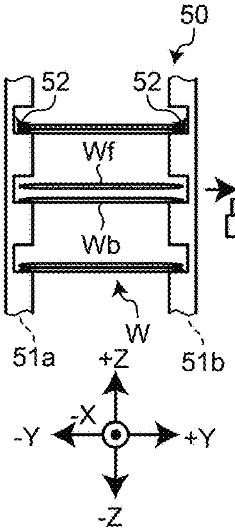
Figure 12C:
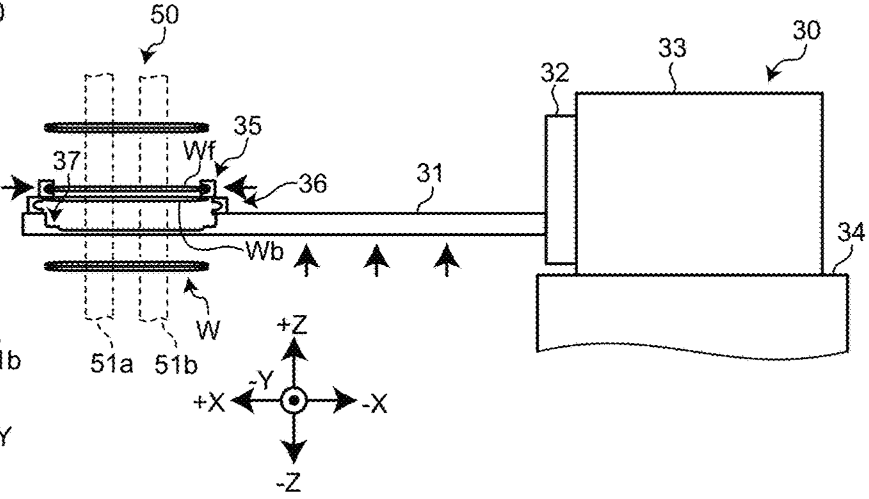

As illustrated in FIGS. 12Ca and 12Cb, the transfer robot 30 closes the holders 35 facing each other in the X direction. As a result, the lower ends of the holders 35 are inserted between the substrates Wf and Wb vertically superposed, and the upper substrate Wf is lifted from the lower substrate Wb, and is further held by the holders 35. At this time, the lower ends of the holders 35 are in contact with the back surfaces of the substrates Wf and Wb, but there is no problem since the semiconductor device element is formed on the front surfaces of the substrates Wf and Wb.

The transfer robot 30 further raises the arm 31 by the base 32. As a result, the lower ends of the lower holders 36 of the holders 35 and 36 of the arm 31 are located at substantially the same height as the height of the lower substrate Wb remaining on the pair of claws 52.

Figure 13A:
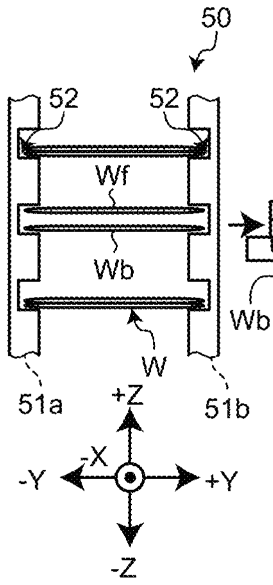
FIGS. 13Aa to 13Bb are schematic diagrams illustrating the example of the operation in which the transfer robot according to the embodiment takes out the pair of substrates from the boat.
Figure 13A:
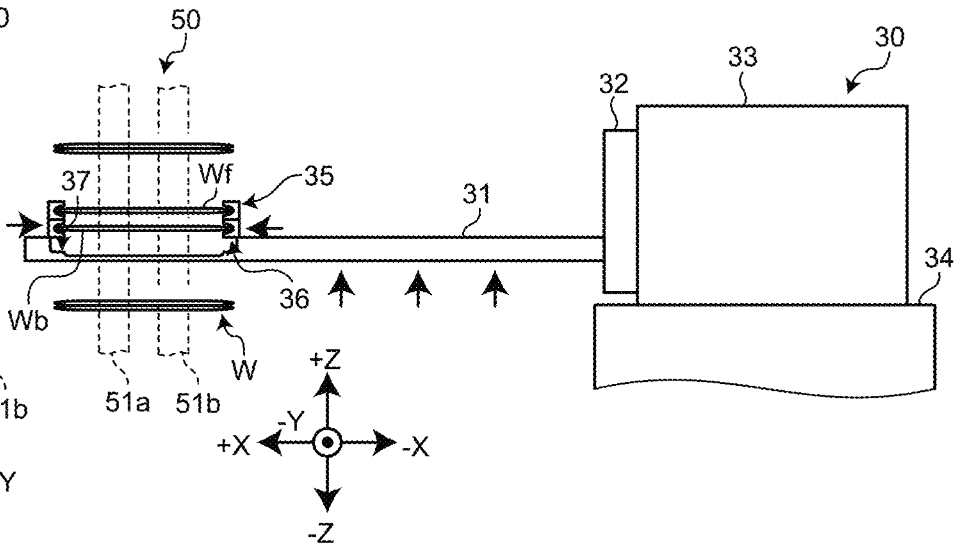

As illustrated in FIGS. 13Aa and 13Ab, the transfer robot 30 closes the holders 36 facing each other in the X direction to hold the substrate Wb on the pair of claws 52. The transfer robot 30 further raises the arm 31 by the base 32. As a result, the substrate Wb supported by the pair of claws 52 is lifted from these claws 52.

Figure 13B:
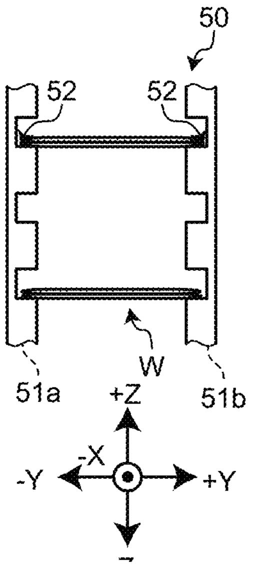
Figure 13B:
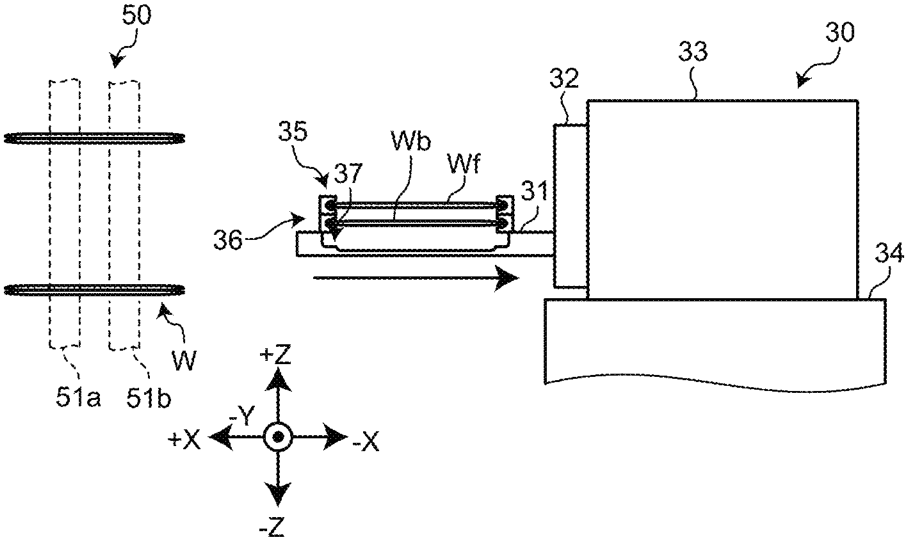

As illustrated in FIGS. 13Ba and 13Bb, the transfer robot 30 contracts the arm 31. As a result, in a state that the two substrates Wf and Wb are respectively held by the upper and lower holders 35 and 36, the arm 31 is pulled out from the boat 50 to take out the pair of substrates Wf and Wb from the boat 50.

The arm 31 of the transfer robot 30 holds the substrate Wf and the substrate Wb at a predetermined interval by holding the substrates Wf and Wb with respective holders 35 and 36 arranged vertically.

For transfer of description, in the example in FIGS. 12Aa to 13Bb, one pair of substrates Wf and Wb is taken out from the plurality of pairs of substrates Wf and Wb arranged in the vertical direction in the boat 50. However, when all the substrates W in the boat 50 are unloaded, the substrates W accommodated in the boat 50 are generally transferred in order, for example, from the lowermost to the uppermost positions in the boat 50.

Next, an operation example of transferring the upper substrate Wf from the transfer robot 30 to the transfer robot 20 will be described with reference to FIGS. 14A to 15Bb.

Figure 14A:
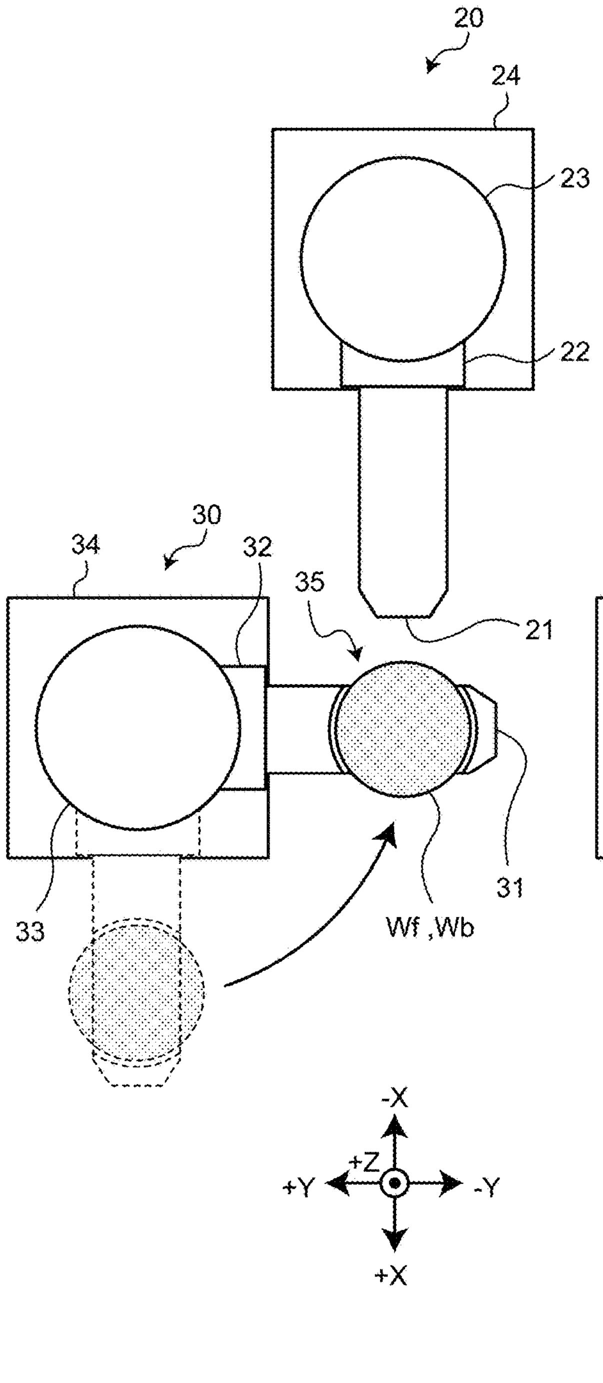
FIGS. 14A and 14B are schematic diagrams illustrating an example of an operation in which the transfer robot according to the embodiment transfers the pair of substrates toward the other transfer robot.
Figure 14B:
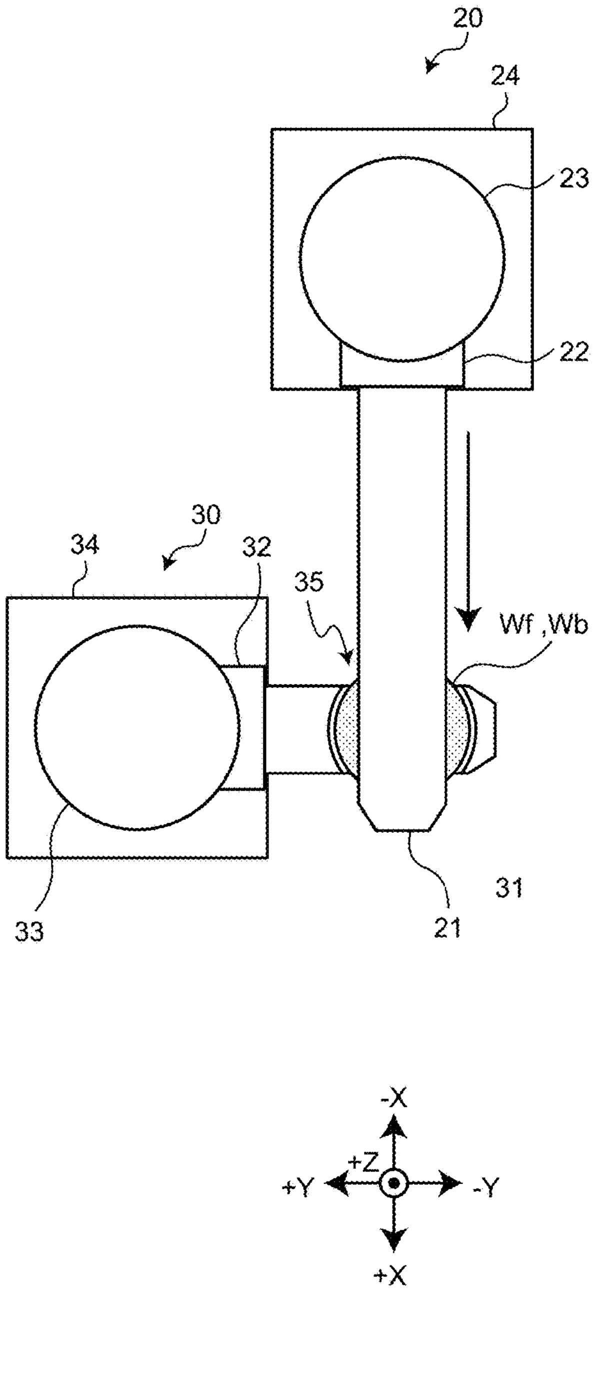

FIGS. 14A and 14B are schematic diagrams illustrating an example of an operation in which the transfer robot 30 according to the embodiment transfers the pair of substrates Wf and Wb to the other transfer robot 20. FIGS. 14A and 14B are top views of the transfer robots 20 and 30.

As illustrated in FIG. 14A, the transfer robot 20 stands by, for example, in front of the transfer robot 30, i.e., on a side of the −X direction, in a state that the arm 21 is contracted.

The transfer robot 30 rotates the rotating unit 33 in the horizontal direction to direct the arm 31 that has been directed to the boat 50 toward the transfer robot 20. In other words, the tip portion of the arm 31 that has been directed in the +X direction is rotated 90° toward the −Y direction.

As illustrated in FIG. 14B, the transfer robot 20 extends the arm 21 in the +X direction. As a result, the tip portion of the arm 21 is extended above the tip portion of the arm 31 of the transfer robot 30.

When the substrate W is transferred from the transfer robot 30 to the transfer robot 20, the positions of the arms 21 and 31 are controlled such that, as described above, the extending direction of the arm 21 of the transfer robot 20 intersects the extending direction of the arm 31 of the transfer robot 30.

Figure 15A:
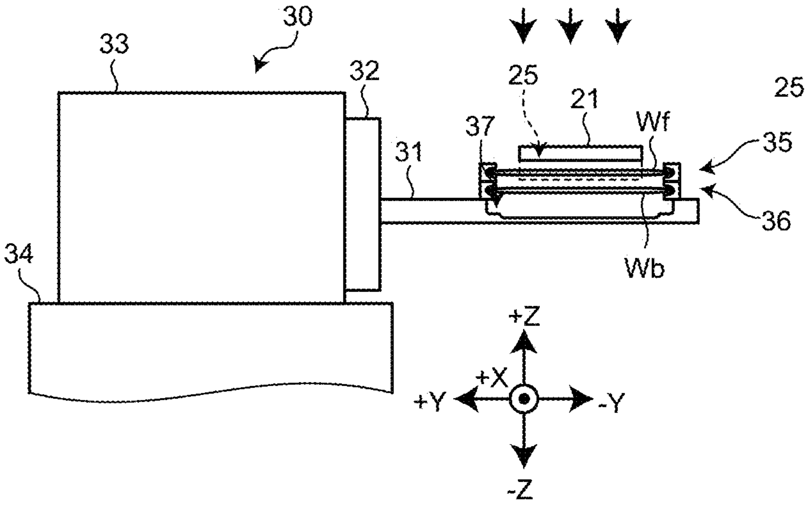
FIGS. 15Aa and 15Bb are schematic diagrams illustrating an example of an operation in which the transfer robot according to the embodiment transfers an upper substrate of the pair of substrates to the other transfer robot.
Figure 15A:
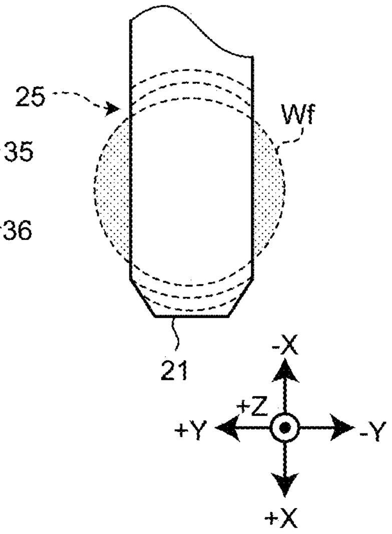

FIGS. 15Aa to 15Bb are schematic diagrams illustrating an example of an operation in which the transfer robot 30 according to the embodiment transfers the upper substrate Wf of the pair of substrates Wf and Wb to the other transfer robot 20.

Note that FIGS. 15Aa and 15Ba are side views of the transfer robot 30 seen from the inside of the housing 60 of the substrate processing apparatus 1 to the front of the substrate processing apparatus 1. FIGS. 15Ab and 15Bb are top views of the arm 21 of the transfer robot 20 located above the arm 31 of the transfer robot 30. However, in FIGS. 15Aa to 15B, a part of the arm 21 is illustrated as a perspective view.

As illustrated in FIGS. 15Aa and 15Ab, the transfer robot 20 lowers the arm 21 positioned above the arm 31 of the transfer robot 30. As a result, among the two substrates Wf and Wb held by the upper and lower holders 35 and 36 of the arm 31, the holders 25 of the arm 21 of the transfer robot 20 are located at the height position of the upper substrate Wf.

Figure 15B:
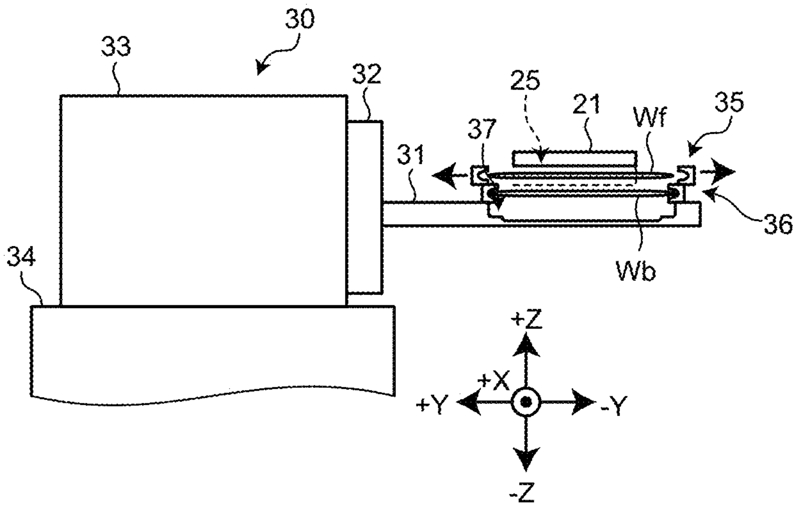
Figure 15B:
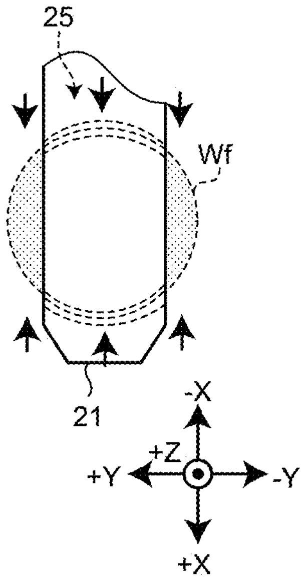

As illustrated in FIGS. 15Ba and 15Bb, the transfer robot 20 closes the holders 25 facing each other in the X direction of the arm 21 to hold the substrate Wf, held by the holders 35 of the transfer robot 30, at both ends in the X direction. The transfer robot 30 opens the holders 35 of the arm 31 facing each other in the Y direction to release the substrate Wf.

Initially, as described above, the arm 31 of the transfer robot 30 holds the substrates Wf and Wb at a predetermined interval by holding the substrates Wf and Wb with respective holders 35 and 36 arranged vertically. Therefore, the transfer robot 20 can hold only the upper substrate Wf of the two substrates Wf and Wb by the holders 25 of the arm 21.

When the transfer robot 20 receives the upper substrate Wf of the pair of substrates Wf and Wb, the transfer robot 20 holds the substrate Wf from the front surface, as described above, to receive the substrate Wf from the transfer robot 30. As a result, the substrate Wf held by the arm 31 of the transfer robot 30 is held by the arm 21 of the transfer robot 20 with the front surface facing up toward the arm 21.

When the transfer robot 30 transfers the substrate Wf to the transfer robot 20, with reference to the front, rear, left, and right directions of the substrate processing apparatus 1, both ends of the substrate Wf in the X direction are held by the holders 25 of the transfer robot 20, and both ends of the substrate Wf in the Y direction are held by the holders 35 of the transfer robot 30. As a result, the substrate Wf can be transferred between the transfer robots 20 and 30.

Thereafter, in order to place the first substrate Wf in the storage container 40, the transfer robot 20 performs the above-described operation in FIGS. 6A and 6B in the opposite direction in a state that the substrate Wf is held by the arm 21. In other words, the transfer robot 20 contracts the arm 21 located above the arm 31 of the transfer robot 30, and the arm 21 that has been directed in the +X direction is rotated 180°, by the rotating unit 23, to be directed in the −X direction.

Figure 16A:
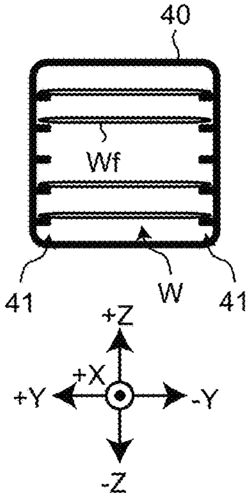
FIGS. 16Aa to 16Cb are schematic diagrams illustrating an example of an operation in which the transfer robot according to the embodiment places the upper substrate of the pair of substrates in the storage container.
Figure 16A:
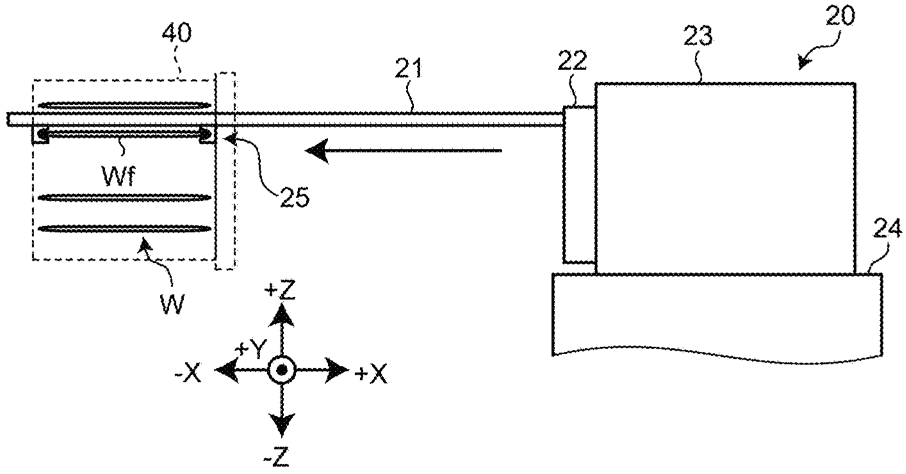

FIGS. 16Aa to 16Cb are schematic diagrams illustrating an example of the operation in which the transfer robot 20 according to the embodiment places the upper substrate Wf of the pair of substrates Wf and Wb in the storage container 40.

FIGS. 16Aa, 16Ba, and 16Ca are front views of the storage container 40 seen from the inside of the housing 60 of the substrate processing apparatus 1 to the front of the substrate processing apparatus 1. FIGS. 16Ab, 16Bb, and 16Cb are side views of the storage container 40 and the transfer robot 20 seen from the +Y to −Y directions. However, in FIG. 16Ab, FIG. 16Bb, and FIG. 16Cb, the storage container 40 is illustrated as a perspective view.

As illustrated in FIGS. 16Aa and 16Ab, the transfer robot 20 extends the arm 21 in the −X direction, and inserts the tip portion of the arm 21 into the storage container 40. As a result, the tip portion of the arm 21 is inserted slightly above the pair of shelves 41 in the storage container 40. In other words, the transfer robot 20 inserts the arm 21 above the pair of shelves 41 that will support the substrate Wf.

Figure 16B:
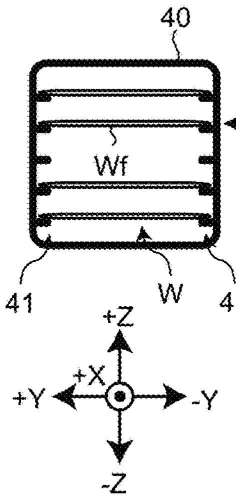
Figure 16B:
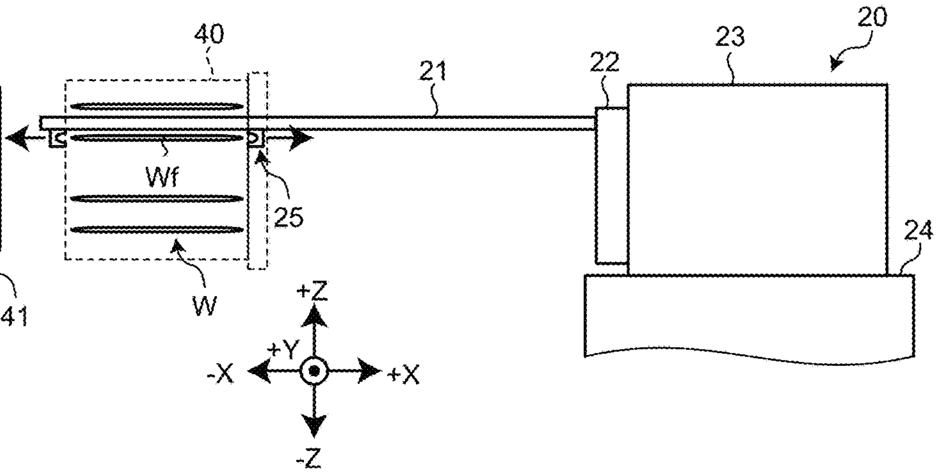

As illustrated in FIGS. 16Ba and 16Bb, the transfer robot 20 opens the holders 25 facing each other in the X direction of the arm 21 to release the substrate Wf. As a result, the substrate Wf is held on the pair of shelves 41 of the storage container 40.

Figure 16C:
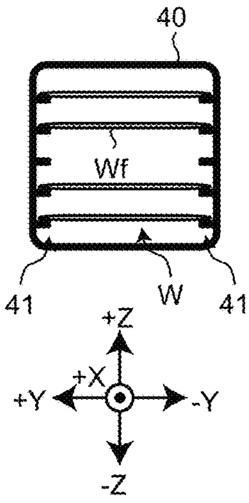
Figure 16C:
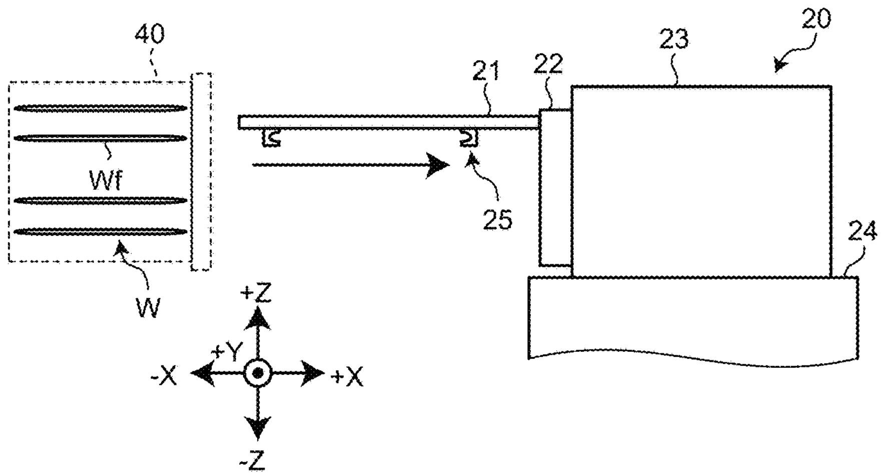

As illustrated in FIGS. 16Ca and 16Cb, the transfer robot 20 raises the arm 21 by the base 22, adjusts the holders 25 to a position higher than the substrate Wf held by the pair of shelves 41, and then contracts the arm 21 to pull out the tip portion of the arm 21 from the storage container 40. As a result, the substrate Wf is housed in the storage container 40.

For transfer of description, in the example in FIGS. 16Aa to 16Cb, the substrate Wf is housed between the substrates W in the vertical direction already housed in the storage container 40. However, in a case where all the substrates W in the storage container 40 are loaded and all the substrates W are unloaded again, the substrates W sequentially collected from the boat 50 are generally transferred, for example, in order from the uppermost to the lowermost positions in the storage container 40.

Thereafter, in order to receive the other substrate Wb from the transfer robot 30, the transfer robot 20 performs the same operation as the above-described operation in FIGS. 6A and 6B in a state that the substrate W is not held by the arm 21. In other words, the transfer robot 20 causes the rotating unit 23 to rotate the arm 21 180° so as to direct the arm 21 that has been directed in the −X direction toward the +X direction, and extends the arm 21 above the arm 31 of the transfer robot 30.

Figure 17A:
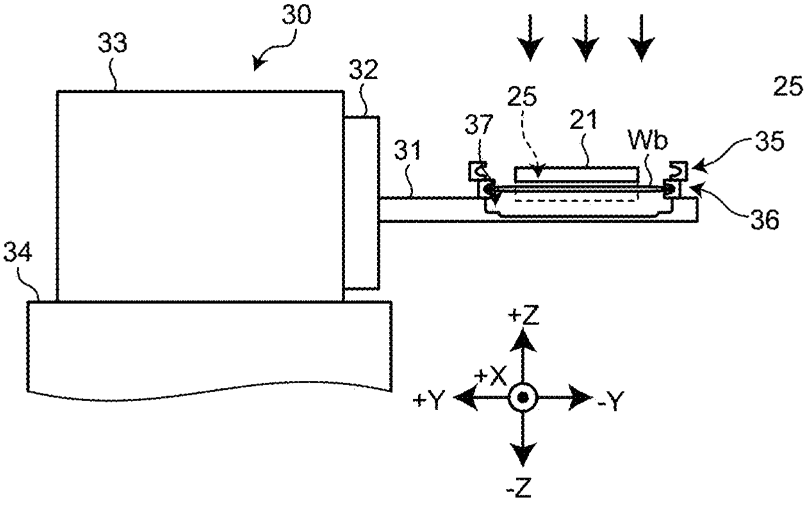
FIGS. 17Aa to 17Bb are schematic diagrams illustrating an example of an operation in which the transfer robot according to the embodiment transfers a lower substrate of the pair of substrates to the other transfer robot.
Figure 17A:
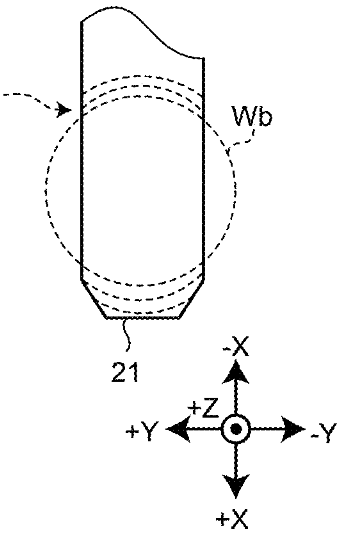

FIGS. 17Aa to 17Bb are schematic diagrams illustrating an example of an operation in which the transfer robot 30 according to the embodiment transfers the lower substrate Wb of the pair of substrates Wf and Wb to the other transfer robot 20.

Note that FIGS. 17Aa and 17Ba are side views of the transfer robot 30 seen from the inside of the housing 60 of the substrate processing apparatus 1 to the front of the substrate processing apparatus 1. FIGS. 17Ab and 17Bb are top views of the arm 21 of the transfer robot 20 located above the arm 31 of the transfer robot 30. However, in FIGS. 17Aa to 17Bb, a part of the arm 21 is illustrated as a perspective view.

As illustrated in FIGS. 17Aa and 17Ab, the transfer robot 20 lowers the arm 21 positioned above the arm 31 of the transfer robot 30. As a result, the holders 25 of the arm 21 of the transfer robot 20 are located at the height position of the substrate Wb held by the lower holders 36 of the upper and lower holders 35 and 36 of the arm 31.

Figure 17B:
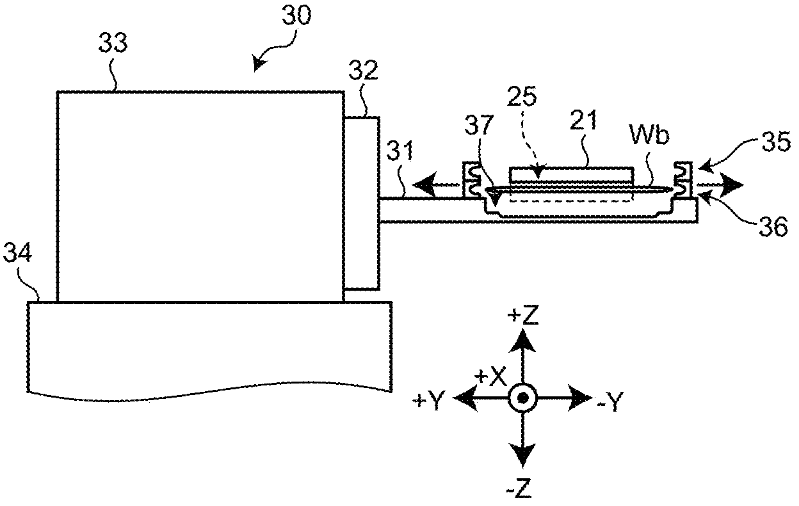
Figure 17B:
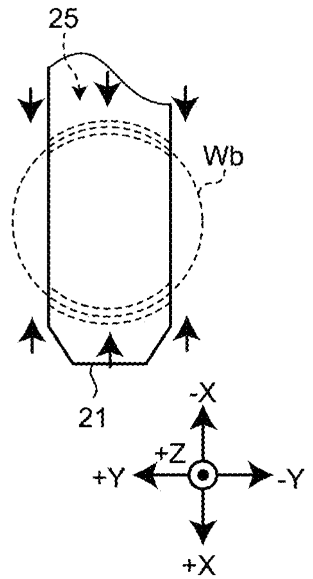

As illustrated in FIGS. 17Ba and 17Bb, the transfer robot 20 closes the holders 25 facing each other in the X direction of the arm 21 to hold the substrate Wb held by the holders 36 of the transfer robot 30 at both ends in the X direction. The transfer robot 30 opens the holders 36 facing each other in the Y direction of the arm 31 to release the substrate Wb.

As described above, when the transfer robot 20 receives the lower substrate Wb of the pair of substrates Wf and Wb, the transfer robot 20 holds the substrate Wb from the back surface to receive the substrate Wb from the transfer robot 30. As a result, the substrate Wb held by the arm 31 of the transfer robot 30 is held by the arm 21 of the transfer robot 20 with the back surface facing up toward the arm 21.

When the lower substrate Wb is transferred, with reference to the front, rear, left, and right directions of the substrate processing apparatus 1, both ends of the substrate Wb in the X direction are also held by the holders 25 of the transfer robot 20, and both ends of the substrate Wb in the Y direction are held by the holders 35 of the transfer robot 30. As a result, the substrate Wb can be transferred between the transfer robots 20 and 30.

Thereafter, in order to house the second substrate Wb in the storage container 40, the transfer robot 20 performs the above-described operation in FIGS. 6A and 6B in the opposite direction. In other words, the transfer robot 20 contracts the arm 21 located above the arm 31 of the transfer robot 30, and the arm 21 that has been directed in the +X direction is rotated 180°, by the rotating unit 23, to be directed in the −X direction.

Figure 18A:
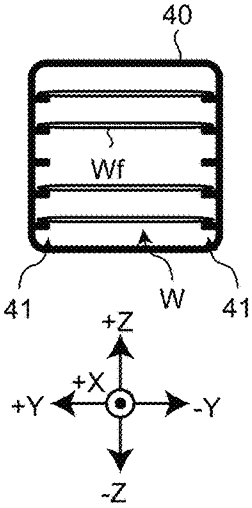
FIGS. 18Aa to 18Cb are schematic diagrams illustrating an example of an operation in which the transfer robot according to the embodiment places the lower substrate of the pair of substrates in the storage container.
Figure 18A:
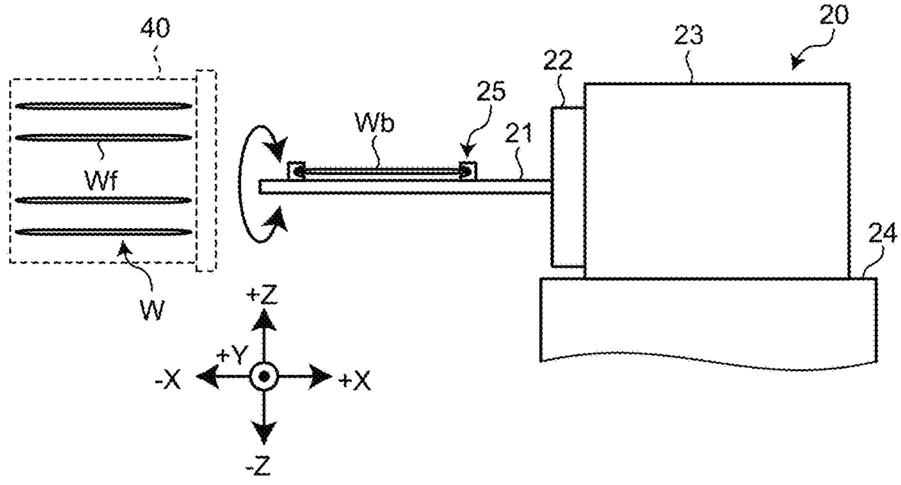

FIGS. 18Aa to 18Cb are schematic diagrams illustrating an example of an operation in which the transfer robot 20 according to the embodiment places the substrate Wb on the lower side of the pair of substrates in the storage container 40.

FIGS. 18Aa, 18Ba, and 18Ca are front views of the storage container 40 seen from the inside of the housing 60 of the substrate processing apparatus 1 to the front of the substrate processing apparatus 1. FIGS. 18Ab, 18Bb, and 18Cb are side views of the storage container 40 and the transfer robot 20 seen from the +Y to −Y directions. However, in FIG. 18Ab, FIG. 18Bb, and FIG. 18Cb, the storage container 40 is illustrated as a perspective view.

As illustrated in FIGS. 18Aa and 18Ab, the transfer robot 20 rotates the arm 21 around the axis by the base 22 to reverse the front and back surfaces of the substrate Wb. As a result, the substrate Wb held below the arm 21 in a state that the front surface faces downward is held above the arm 21 in a state that the front surface faces upward.

Figure 18B:
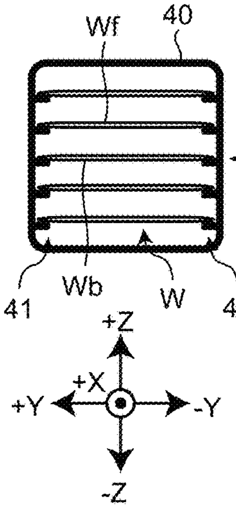
Figure 18B:
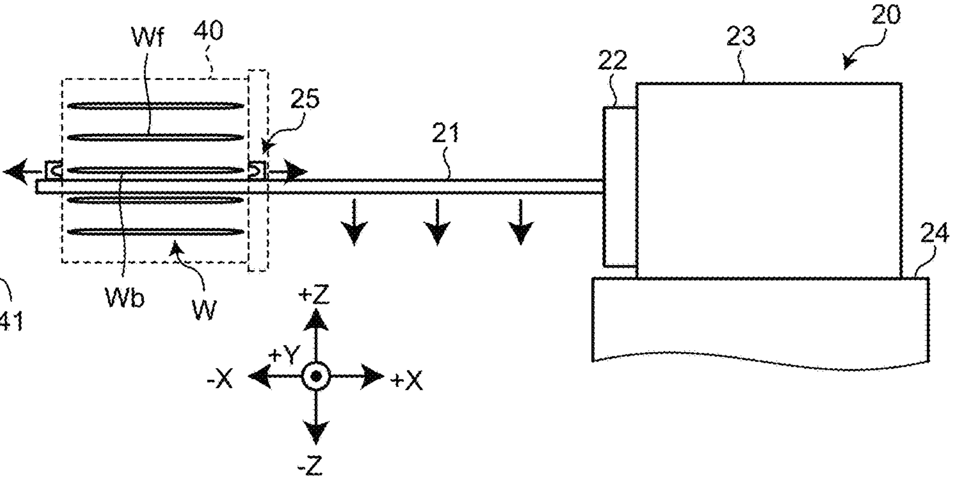

As illustrated in FIGS. 18Ba and 18Bb, the transfer robot 20 extends the arm 21 in the −X direction, and inserts the tip portion of the arm 21 into the storage container 40. As a result, the tip portion of the arm 21 is inserted slightly above the pair of shelves 41 in the storage container 40. In other words, the transfer robot 20 inserts the arm 21 above the pair of shelves 41 that will support the substrate Wb.

Note that, in the example in FIG. 18Bb, the arm 21 is inserted below the previously transferred substrate Wf, but the position to insert the arm 21 can be controlled by using an empty slot in the storage container 40 as a target, i.e., any shelf 41 not supporting the substrate W.

However, when all the substrates W in the storage container 40 are loaded and all the substrates W are unloaded again, it is preferable that these substrates W are housed in the storage container in the order similar to the order of the substrates W in the storage container 40 before loading. This is because, in the manufacturing process of the semiconductor device, the substrates W are usually managed, for example, in units of one lot for each storage container 40.

As illustrated in FIGS. 18Ba and 18Bb, the transfer robot 20 opens the holders 25 facing each other in the X direction of the arm 21 to release the substrate Wb. The transfer robot 20 lowers the arm 21 by the base 22. As a result, the substrate Wf is held on the pair of shelves 41 of the storage container 40.

Figure 18C:
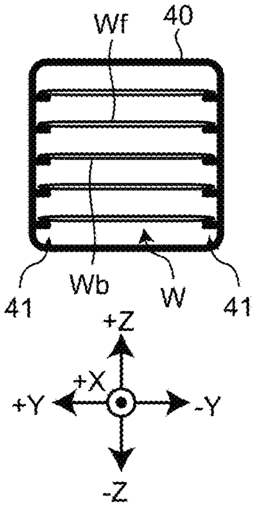
Figure 18C:
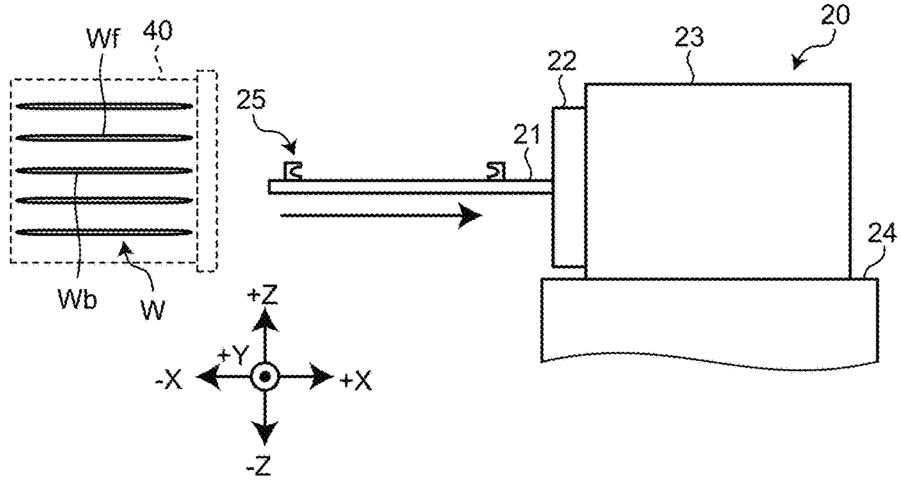

As illustrated in FIGS. 18Ca and 18Cb, the transfer robot 20 further lowers the arm 21 by the base 22 to adjust the holders 25 to be located at a position lower than the substrate Wb held by the pair of shelves 41, and then contracts the arm 21 to pull out the tip portion of the arm 21 from the storage container 40. As a result, the substrate Wb is housed in the storage container 40.

Thus, the unloading operation of the pair of substrates Wf and Wb by the transfer robots 20 and 30 ends.

Thereafter, the transfer robots 20 and 30 repeat the above unloading operation to take out all the substrates W in the boat 50 and place the substrates W in the storage container 40. As described above, when the substrates W for a plurality of lots are loaded from the plurality of storage containers 40, the substrates W may be continuously unloaded from these storage containers 40.

(Method for Manufacturing Semiconductor Device)

Next, an example of processing the substrates W by the substrate processing apparatus 1 will be described with reference to FIGS. 19A to 21B. FIGS. 19A to 20B are cross-sectional views illustrating an example of a procedure of processing the substrates W by the substrate processing apparatus 1 according to the embodiment.

Substrate processing by the substrate processing apparatus 1 according to the embodiment is performed, for example, as one process in a method for manufacturing the semiconductor device. FIGS. 19A to 20B illustrate an example when the substrate processing by the substrate processing apparatus 1 is performed as one process of a method for manufacturing a three-dimensional nonvolatile memory including a memory cell MC, which is a semiconductor device SD illustrated in FIGS. 21A and 21B.

Figure 19A:
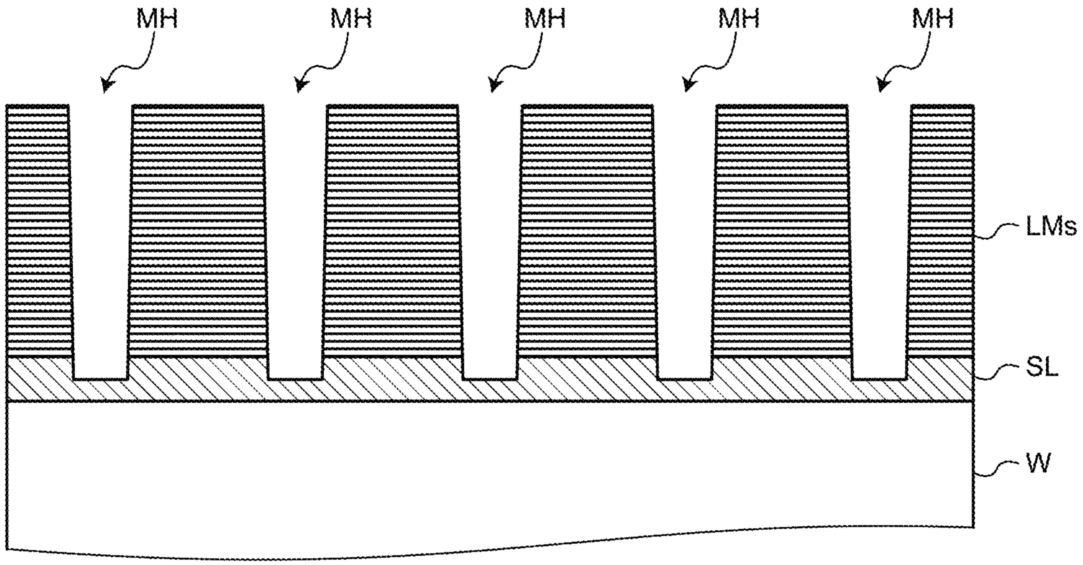
FIGS. 19A and 19B are cross-sectional views illustrating an example of a procedure of processing the substrate by the substrate processing apparatus according to the embodiment.

As illustrated in FIG. 19A, a source line SL and a laminated film LMs are formed in this order on the substrate W to be processed by the substrate processing apparatus 1. The source line SL is a conductive layer such as a Poly-Si layer. The laminated film LMs is configured, for example, by alternately laminating, one layer by one layer, a plurality of $SiO_2$ layers and a plurality of SiN layers. In the laminated film LMs, a plurality of fine memory holes MH penetrating the laminated film LMs and reaching the source line SL is formed at high density.

As will be described later, a plurality of different layers such as a memory layer ME, a channel layer CN, and a core layer CR (see FIGS. 21A and 21B) is formed in the memory hole MH. The memory layer ME has a laminated structure in which a block insulating layer BK, a charge storage layer CT, and a tunnel insulating layer TN (see FIGS. 21A and 21B) are laminated in this order from an outer periphery of the memory hole MH.

Among these different layers, the block insulating layer BK, the tunnel insulating layer TN, and the core layer CR are, for example, $SiO_2$ layers. The charge storage layer CT is, for example, the SiN layer, and the channel layer CN is, for example, the Si layer.

As described above, a metal oxide nitride oxide silicon (MONOS) film of the plurality of different layers is formed in the memory hole MH.

Figure 19B:
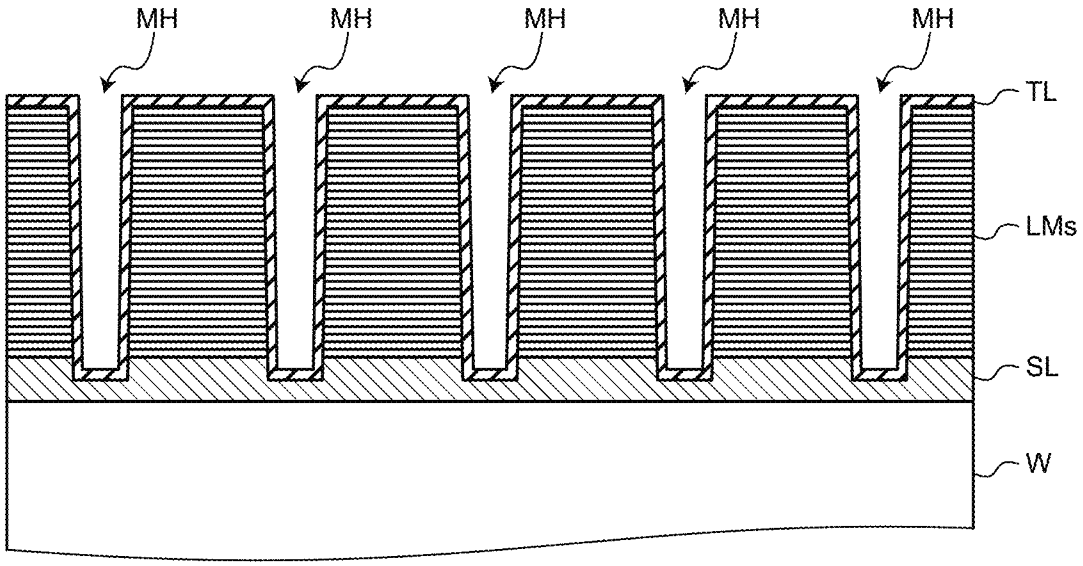

As illustrated in FIG. 19B, in the substrate processing apparatus 1, at least one of these different layers such as the tunnel insulating layer TN is formed as a predetermined layer TL by, for example, the ALD.

The substrate processing is performed by loading the boat 50 accommodating the plurality of pairs of substrates Wf and Wb into the reactor 10. As described above, the back surfaces of the pair of the substrates Wf and Wb face each other and are superposed. When the predetermined layer TL to be formed is, for example, the $SiO_2$ layer such as the tunnel insulating layer TN, a source gas of Si such as $SiH_4$ gas and an oxidizing gas such as $O_2$ gas are supplied as the treatment gas from the numerous holes 15 of the nozzle 14 into the inner tube 13 of the reactor 10.

The treatment gas supplied from the nozzle 14 passes between the plurality of pairs of substrates Wf and Wb, is discharged to the outside of the inner tube 13 from a slit (not illustrated) on the side surface of the inner tube 13, and is further discharged to the outside of the substrate processing apparatus 1 via the exhaust port 12 of the outer tube 11.

At this time, in the plurality of pairs of substrates Wf and Wb, an upward-directed front surface of the substrate Wf and a downward-directed front surface of the substrate Wb are exposed to the treatment gas. The substrates Wf and Wb are heated to a desired temperature by the heater 90, and when the source gas comes into contact with the front surfaces of the substrates Wf and Wb, the source gas is decomposed by thermochemical reaction, a decomposition product is further oxidized by the oxidizing gas, and the $SiO_2$ layer is deposited in units of one to several atoms.

As a result, the predetermined layer TL such as the $SiO_2$ layer is formed on an upper surface of the laminated film LMs formed on the substrate W and the side surface and the bottom surface of the memory hole MH formed in the laminated film LMs.

As described above, by performing the substrate processing by the substrate processing apparatus 1 configured as, for example, an ALD apparatus, the predetermined layer TL can be formed with good step coverage even in the fine memory hole MH and with a uniform layer thickness over the entire region of the substrate W.

Figure 20A:
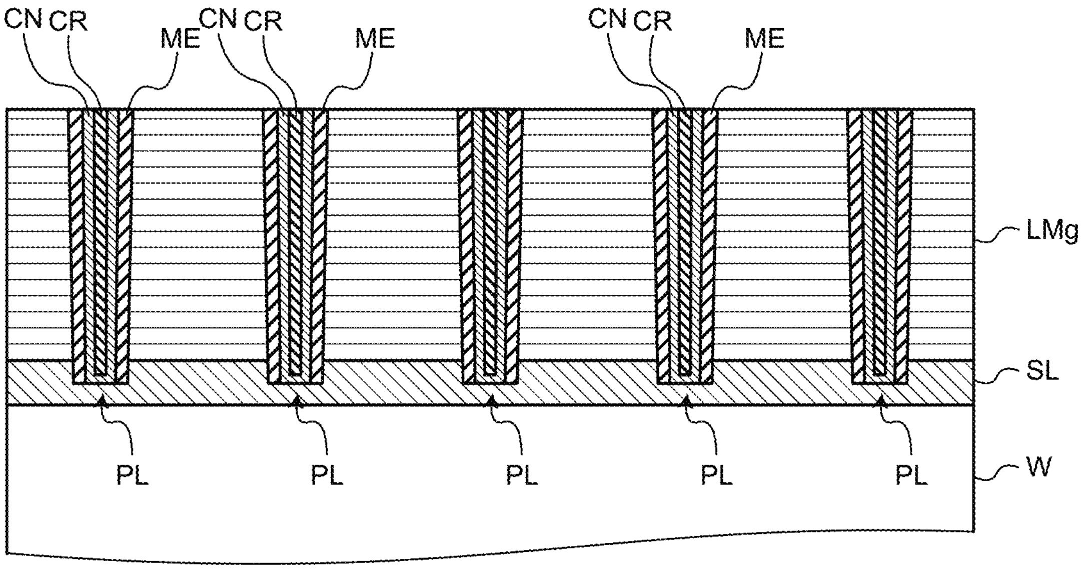
FIGS. 20A and 20B are cross-sectional views illustrating the example of the procedure of processing the substrate by the substrate processing apparatus according to the embodiment.

As illustrated in FIG. 20A, a memory pillar PL is obtained by forming the plurality of different layers in the memory hole MH. Specifically, the memory layer ME, the channel layer CN, and the core layer CR are formed in order from the outer periphery of the memory hole MH. The channel layer CN is also formed on a bottom surface of the memory hole MH.

Figure 21A:
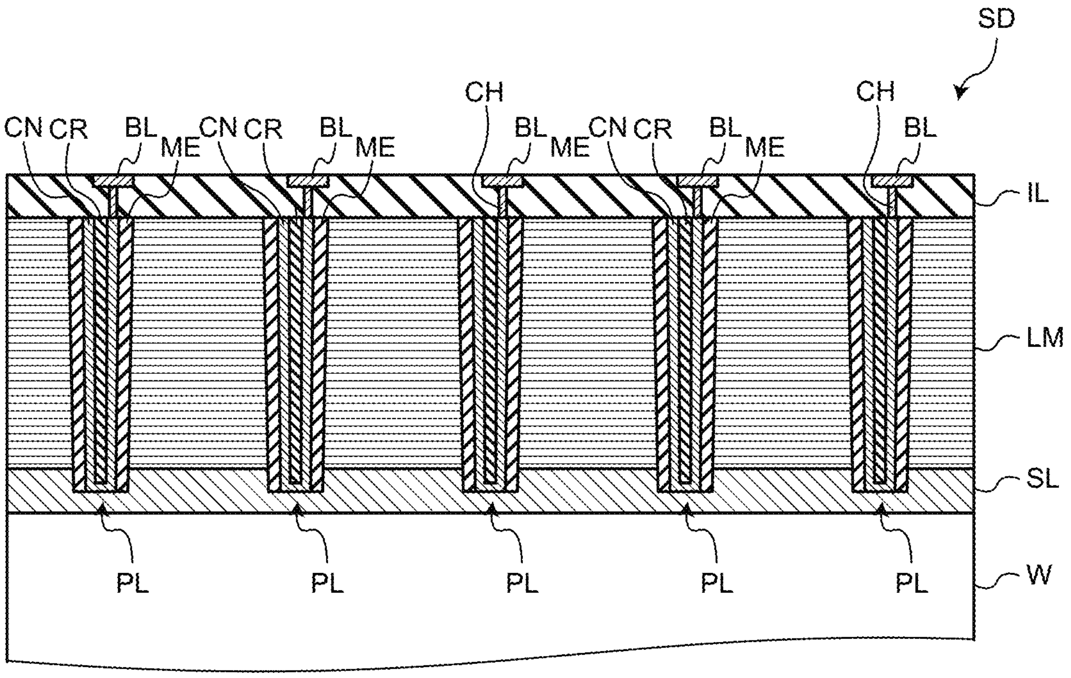
FIGS. 21A and 21B are cross-sectional views illustrating an example of a configuration of a semiconductor device according to the embodiment.
Figure 21B:
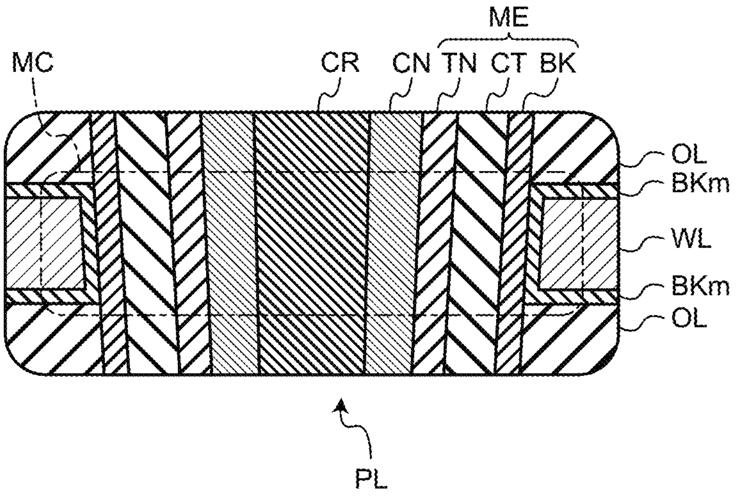

Thereafter, the plurality of SiN layers in the laminated film LMs is replaced with a conductive layer, such as a W layer, to form a word line WL (see FIGS. 21A and 21B). At this time, prior to the formation of the word line WL, a metal block layer such as an $Al_2O_3$ layer is formed on a side surface of the memory pillar PL at a height position of the word line WL.

In other words, after the memory pillar PL is formed, the plurality of SiN layers in the laminated film LMs is removed to form a laminated film LMg. The laminated film LMg is a film having a gap layer GP between a plurality of insulating layers OL. The SiN layer is removed in the gap layer GP. The insulating layer OL corresponds to the $SiO_2$ layer in the laminated film LMs described above.

Figure 20B:
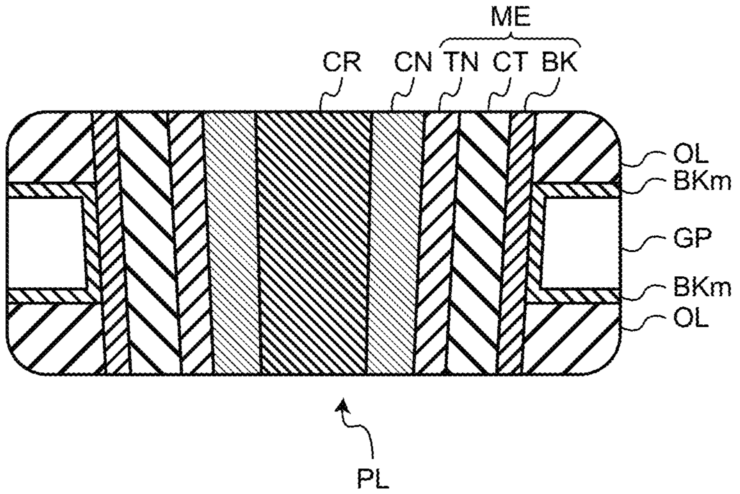

As illustrated in a partial enlarged view of the memory pillar PL in FIG. 20B, a metal block layer BKm such as the $Al_2O_3$ layer is formed on a lower surface and an upper surface of the insulating layer OL above and below the gap layer GP, and the side surface of the pillar PL exposed to the gap layer GP.

The substrate processing apparatus 1 according to the embodiment can also be used for forming the metal block layer BKm. In this case, the boat 50 accommodating the plurality of pairs of substrates Wf and Wb is loaded into the reactor 10, and the source gas of Al such as TMA gas, the oxidizing gas such as $O_2$ gas, and the like are supplied as the treatment gas to deposit the $Al_2O_3$ layer in units of one to several atoms.

As described above, by performing the substrate processing by the substrate processing apparatus 1 configured as, for example, the ALD apparatus, the predetermined layer such as the $Al_2O_3$ layer can be formed with good step coverage even in the gap layer GP that is a fine space, and with a uniform layer thickness over the entire region of the substrate W.

Thereafter, the gap layer GP is filled with the W layer or the like to form the word line WL, so that the memory pillar PL will have a metal alumina nitride oxide silicon (MANOS) film of the plurality of different layers.

In addition, a plurality of contacts (not illustrated) is formed, and each of the plurality of word lines WL is led out to an upper layer side. Still more, an upper layer wiring or the like is formed and connected to each of the plurality of memory pillars PL.

As described above, the semiconductor device SD illustrated in FIGS. 21A and 21B is manufactured.

FIGS. 21A and 21B are cross-sectional views illustrating an example of a configuration of the semiconductor device SD according to the embodiment. FIG. 21A is a cross-sectional view of a part of the semiconductor device SD where the memory pillar PL is formed, and FIG. 21B is a partial enlarged cross-sectional view of the memory pillar PL.

As illustrated in FIGS. 21A and 21B, the semiconductor device SD includes the source line SL, a laminated film LM, and an insulating layer IL that are disposed on the substrate W in order from the substrate W side. In the laminated film LM, the plurality of word lines WL and the plurality of insulating layers OL are alternately laminated one layer by one layer. As described above, the word line WL is a layer in which the SiN layer in the laminated film LMs is replaced with the W layer or the like.

In the laminated film LM, a plurality of fine memory pillars PL penetrating the laminated film LM and reaching the source line SL is arranged. The memory pillar PL includes the memory layer ME, the channel layer CN, and the core layer CR in this order from the outer periphery. The memory layer ME includes the block insulating layer BK, the charge storage layer CT, and the tunnel insulating layer TN in this order from the outer periphery of the memory pillar PL. In addition, the pillar PL includes the metal block layer BKm at a height position of the plurality of word lines WL on the outer periphery of the memory layer ME.

The memory cell MC is formed at an intersection of the memory pillar PL and each of the plurality of word lines WL. In other words, a plurality of memory cells MC arranged in the height direction is formed in one memory pillar PL. This memory pillar PL is arranged at a high density in the laminated film LM, so that the semiconductor device SD is configured as, for example, a three-dimensional nonvolatile memory in which the plurality of memory cells MC is three-dimensionally arranged.

By applying a predetermined voltage to a predetermined word line WL via a contact (not illustrated), data can be written to and read from the memory cell MC connected to the word line WL.

(Overview)

In the manufacturing process of the semiconductor device, the substrate processing apparatus such as the vertical furnace is employed for forming the redetermined layer on the substrate. In this substrate processing apparatus, for example, the boat accommodating several lots of substrates is loaded into the reactor to perform the film formation process.

In recent years, with miniaturization of the semiconductor device, fine irregularities are formed on a substrate front surface at high density to substantially increase a front surface area, i.e., a formation area of the predetermined layer, of the substrate. It has been found that, when processing of a substrate having an increased surface area is performed in the above-described substrate processing apparatus, a uniform layer thickness of the predetermined layer is achieved while retaining a step coverage of fine irregularities by doubling a pitch between the substrates accommodated in the boat.

However, when the pitch is doubled, the number of substrates that can be processed at once is reduced to, for example, half or less. As a result, productivity is greatly reduced. The present inventor has considered that it is possible to improve the productivity of the semiconductor device by accommodating two substrates, instead of one substrate, in a pair of claws of the boat in a state that the substrates are superposed with the back surfaces facing each other while broadening the pitch between the substrates accommodated in the boat.

Here, the problem is how to realize a transfer system capable of superposing two substrates with the back surfaces facing each other and accommodating the substrates in this state in the boat.

According to the substrate processing apparatus 1 of the embodiment, the arm 21 of the transfer robot 20 holds both ends of one substrate W in the X direction, and transfers the substrate W between the storage container base 64 of the substrate processing apparatus 1 and the arm 31 of the transfer robot 30. The arm 31 of the transfer robot 30 includes the holders 37 that hold both ends of the two substrates Wf and Wb in the Y direction, and transfer the substrates Wf and Wb between the arm 21 of the transfer robot 20 and the boat 50.

As a result, the two substrates Wf and Wb can be accommodated in one pair of claws 52 of the boat 50. Therefore, it is possible to increase the number of substrates that can be accommodated in the reactor 10 while broadening the pitch between the plurality of pairs of substrates Wf and Wb accommodated in the boat 50. Accordingly, it is possible to improve the productivity of the semiconductor device SD while maintaining the uniform layer thickness of the predetermined layer and good step coverage of fine irregularities.

According to the substrate processing apparatus 1 of the embodiment, the arm 21 of the transfer robot 20 holds the substrate Wb from the back surface, takes out the substrate Wb from the storage container 40, reverses the front and back surfaces of the substrate Wb, and transfers the substrate Wb to the arm of the transfer robot 30. In addition, the arm 21 of the transfer robot 20 holds the substrate Wf from the front surface, takes out the substrate Wf from the storage container 40, and transfers the substrate Wf to the arm 31 of the transfer robot 30 without reversing the front and back surfaces of the substrate Wf. As a result, the two substrates Wf and Wb can be delivered to the transfer robot 30 in the state that the substrates Wf and Wb are superposed with the back surfaces facing each other.

According to the substrate processing apparatus 1 of the embodiment, when the substrate Wb having the front surface directed downward and the substrate Wf having the front surface directed upward and overlaid on the back surface of the substrate Wb are placed on the pair of claws 52 of the boat 50, the substrate Wf is held by the holders 35 of the transfer robot 30, and the substrate Wb is held by the holders 36 so as to be taken out from the boat 50. As a result, the two substrates Wf and Wb superposed with the back surfaces facing each other can be unloaded from the boat 50.

According to the substrate processing apparatus 1 of the embodiment, when one pair of the substrates Wf and Wb is taken out from the boat 50, the arm 31 of the transfer robot 30 holds the substrate Wf by the holders 35 and then holds the substrate Wb by the holders 36. As a result, the substrate Wf overlaid on the substrate Wb can be lifted and held, and then the substrate Wb supported by the pair of claws 52 can be held and taken out from the boat 50. Therefore, the two substrates Wf and Wb can be taken out from the boat 50 by single transfer operation.

According to the substrate processing apparatus 1 of the embodiment, the arm 21 of the transfer robot 20 receives the substrate Wf held by the holders 35 from the front surface side among the pair of substrates Wf and Wb held by the arm 31 of the transfer robot 30, and places the substrate Wf in the storage container 40. In addition, the arm 21 of the transfer robot 20 receives the substrate Wb held by the holders 36 from the back surface side among the pair of substrates Wf and Wb held by the arm 31 of the transfer robot 30, and reverses the front and back surfaces of the substrate Wb to place the substrate Wb in the storage container 40.

As a result, among the two substrates Wf and Wb, the substrate Wf whose front surface is directed upward can be accommodated in the storage container 40 as it is, and the substrate Wb whose front surface is directed downward can be accommodated in the storage container 40 with the front surface facing upward.

According to the substrate processing apparatus 1 of the embodiment, when the substrate W is transferred between the arm 21 of the transfer robot 20 and the arm 31 of the transfer robot 30, the extending direction of the arm 21 of the transfer robot 20 intersects the extending direction of the arm 31 of the transfer robot 30.

As a result, different end portions of the substrate W can be held by the respective arms 21 and 31, and the substrate W can be transferred between the transfer robots 20 and 30 while suppressing mutual interference between the arms 21 and 31 and the substrate W.

According to the substrate processing apparatus 1 of the embodiment, the substrate processing performed in the reactor 10 is a process of forming the predetermined layer TL by ALD. The above-described method of transferring the substrates Wf and Wb is applicable to film formation by ALD on the substrate W having a large substantial surface area, for example, where process characteristics are easily affected by the pitch between the substrates W.

In the method according to the above-described embodiment, the surfaces facing up and facing down of the pair of substrates Wf and Wb are treated. However, since the pitch between the plurality of pairs of substrates Wf and Wb is appropriately maintained, the flow of the treatment gas discharged from the nozzle 14 to the outside of the inner tube 13 through between the plurality of pairs of substrates Wf and Wb is not hindered. Thus, it is possible to improve the productivity of the semiconductor device SD while maintaining the uniform layer thickness of the predetermined layer and good step coverage of fine irregularities.

Modified Example

Next, a configuration of a modified example of the embodiment will be described. The transfer robot 30 of the modified example is different from the above-described embodiment in that the holders 35 and 36 are also used for loading the substrates W. Note that, in the above modified example, both the holders 35 as the third holder and the holders 36 as the second holder are examples of the first holders.

The transfer robot 30 can load the substrates W using the holders 35 and 36 by performing the operations illustrated in FIGS. 12Aa to 13Bb, FIGS. 15Aa to 15Bb, and FIGS. 17Aa to 17Bb in the opposite direction. Hereinafter, an example of loading the substrate W by the transfer robot 30 according to the modified example will be described with reference to FIGS. 12Aa to 13Bb, FIGS. 15Aa to 15Bb, and FIGS. 17Aa to 17Bb.

As illustrated in FIGS. 17Ba and 17Bb, in a state where the substrate Wb taken out from the storage container 40 is held by the lower surface of the arm 21, the arm 21 of the transfer robot 20 is controlled such that the substrate Wb is located at the height position of the holders 36 provided in the arm 31 of the transfer robot 30.

At this time, the front surface of the substrate Wb faces below toward the arm 31. The holders 35 and 36 of the arm 31 of the transfer robot 30 are both in an open state.

As illustrated in FIGS. 17Aa and 17Ab, the holders 36 of the arm 31 of the transfer robot 30 are closed to hold the substrate Wb at both ends in the Y direction. In addition, the holders 25 of the arm 21 of the transfer robot 20 are opened to release the substrate Wb held by the arm 21 at both ends in the X direction. As a result, the substrate Wb is delivered from the transfer robot 20 to the transfer robot 30.

As illustrated in FIGS. 15Ba and 15Bb, in a state where the substrate Wf taken out from the storage container 40 is held by the lower surface of the arm 21, the arm 21 of the transfer robot 20 is controlled such that the substrate Wf is located at the height position of the holders 35 provided in the arm 31 of the transfer robot 30.

At this time, the front surface of the substrate Wf faces up toward the arm 21. Further, the holders 35 of the arm 31 of the transfer robot 30 are still in the open state.

As illustrated in FIGS. 15Aa and 15Ab, the holders 35 of the arm 31 of the transfer robot 30 are closed to hold the substrate Wf at both ends in the Y direction. The holders 25 of the arm 21 of the transfer robot 20 are opened to release the substrate Wf held by the arm 21 at both ends in the X direction. As a result, the substrate Wf is transferred from the transfer robot 20 to the transfer robot 30.

As illustrated in FIGS. 13Ba and 13Bb, the transfer robot 30 rotates the rotating unit 33 to direct the arm 31 toward the boat 50.

As illustrated in FIGS. 13Aa and 13Ab, the transfer robot 30 extends the arm 31, and inserts the tip portion of the arm 31 holding the two substrates Wf and Wb into the empty slot of the boat 50.

As illustrated in FIGS. 12Ca and 12Cb, the transfer robot 30 opens the holders 36 of the arm 31 to release the substrate Wb. As a result, the substrate Wb is supported by the pair of claws 52 of the boat 50.

As illustrated in FIGS. 12Ba and 12Bb, the transfer robot 30 opens the holders 35 of the arm 31 to release the substrate Wf. As a result, the substrate Wf is overlaid on the back surface of the substrate Wb supported by the pair of claws 52 of the boat 50.

Then, the arm 31 is contracted and pulled out from the boat 50, so that the pair of substrates Wf and Wb is accommodated in the boat 50.

When the holders 35 and 36 of the transfer robot 30 are also used for loading the substrates W as in the above modified example, the holders 37 may not be provided in the arm 31 of the transfer robot 30.

The substrate processing apparatus according to the modified example has a similar effect as that of the substrate processing apparatus 1 according to the above-described embodiment.

Note that, in the substrate processing apparatus 1 according to the above-described embodiment and modified example, for example, the arm 21 of the transfer robot 20 changes the vertical position with respect to the storage container 40 in order to transfer the substrate W. However, the transfer of the substrate W may be performed by changing the vertical position of the storage container 40 with respect to the arm 21. Similarly, for example, the substrate W may be transferred by changing the vertical position of the boat 50 with respect to the arm 31 instead of changing the vertical position of the arm 31 of the transfer robot 30 with respect to the boat 50.

As described above, vertical movement of the arm 21 and the storage container 40 and vertical movement of the arm 31 and the boat 50 are relative to each other, and the substrate W may be transferred by changing the vertical position of at least one of the units.

In addition, the substrate processing by the substrate processing apparatus 1 of the above-described embodiment and modified example is performed, for example, at the time of manufacturing the semiconductor device. However, the substrate processing apparatus having the above-described transfer mechanism is not limited to the semiconductor device, and may be used for processing various types of substrates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:

a boat configured to hold a plurality of substrates taken out from a storage container in a state arranged in a first direction intersecting surfaces of the plurality of substrates;

a reactor that houses the boat and is configured to process the plurality of substrates; and first and second arms that transfer the plurality of substrates, wherein:

the first arm is configured to hold both ends of one substrate in a second direction intersecting the first direction, and to transfer the one substrate between the storage container and the second arm, the second arm includes a first holder configured to support two substrates in a third direction intersecting the first direction and the second direction, the second arm being configured to transfer the two substrates between the first arm and the boat, and the first arm is configured to:

hold a first substrate among the plurality of substrates from a back surface side, take out the first substrate from the storage container, reverse front and back surfaces of the first substrate, and directly transfer the first substrate to the second arm while the front surface of the first substrate faces the second arm, and hold a second substrate among the plurality of substrates from a front surface side, take out the second substrate from the storage container, and directly transfer the second substrate to the second arm without reversing front and back surfaces of the second substrate while the back surface of the second substrate faces the second arm.

2. The substrate processing apparatus according to claim 1, wherein:

the boat includes a plurality of claws arranged at a predetermined interval in the first direction and is configured to hold a first substrate and a second substrate on one of the plurality of claws, the second arm includes:

a second holder configured to hold both ends of one substrate in a direction along an extending direction of the second arm; and a third holder configured to hold both ends of one substrate in the direction along the extending direction of the second arm, the third holder being positioned above the second holder, and for the first substrate and the second substrate placed on one of the plurality of claws, the third holder is configured to hold the second substrate and the second holder is configured to hold the first substrate to take out the first and second substrates from the boat.

3. The substrate processing apparatus according to claim 2, wherein:

the second and third holders are configured to independently hold and release the one substrate, and when the second arm takes out the first and second substrates from the boat, the third holder is configured to hold the second substrate and then the second holder is configured to hold the first substrate.

4. The substrate processing apparatus according to claim 2, wherein:

the first arm is configured to:

receive, from the front surface side, the second substrate held by the third holder among the first and second substrates held by the second arm, and place the second substrate in the storage container, the second substrate being received directly by the first arm from the second arm, and receive, from the back surface side, the first substrate held by the second holder among the first and second substrates held by the second arm, reverse the front and back surfaces of the first substrate, and place the first substrate in the storage container, the first substrate being received directly by the first arm from the second arm.

5. The substrate processing apparatus according to claim 1, wherein:

the first arm is configured to hold one substrate at both ends in a direction along an extending direction of the first arm, the first holder of the second arm is configured to hold one substrate at both ends in a direction along an extending direction of the second arm, and the first arm extends in the third direction and the second arm extends in the second direction when one substrate is transferred between the first arm and the second arm, the second direction and the third direction intersecting each other.

6. The substrate processing apparatus according to claim 5, wherein the second arm is disposed below the first arm when the one substrate is transferred between the first arm and the second arm.

7. The substrate processing apparatus according to claim 1, wherein the processing performed in the reactor is a process of forming a predetermined layer by atomic layer deposition.

8. A substrate processing method comprising:

transferring, by a first arm and a second arm, a plurality of substrates stored in a storage container to a boat configured to accommodate the plurality of substrates, and holding the plurality of substrates in a first direction intersecting surfaces of the plurality of substrates by the boat;

housing the boat holding the plurality of substrates in a reactor; and processing the plurality of substrates inside the reactor, wherein the transferring the plurality of substrates between the storage container and the boat includes:

transferring, by the first arm, a first substrate among the plurality of substrates between the storage container and the second arm by holding both ends of the first substrate, the both ends being ends in a second direction intersecting the first direction; and transferring, by the second arm, the first substrate and a second substrate different from the first substrate among the plurality of substrates between the first arm and the boat by holding the first substrate and the second substrate with a first holder, the first holder holding the first substrate and the second substrate in a third direction intersecting the first direction and the second direction, and wherein when the first and second substrates are transferred from the first arm to the second arm:

the first arm holds a first substrate among the plurality of substrates from a back surface side, takes out the first substrate from the storage container, reverses front and back surfaces of the first substrate, and directly transfers the first substrate to the second arm while the front surface of the first substrate faces the second arm, and the first arm holds a second substrate among the plurality of substrates from a front surface side, takes out the second substrate from the storage container, and directly transfers the second substrate to the second arm without reversing front and back surfaces of the second substrate while the back surface of the second substrate faces the second arm.

9. A method for manufacturing a semiconductor device, the method comprising:

transferring, by a first arm and a second arm, a plurality of substrates stored in a storage container to a boat configured to accommodate the plurality of substrates, and holding the plurality of substrates in a first direction intersecting surfaces of the plurality of substrates by the boat;

housing the boat holding the plurality of substrates in a reactor; and processing the plurality of substrates inside the reactor, wherein the transferring the plurality of substrates between the storage container and the boat includes:

transferring, by the first arm, a first substrate among the plurality of substrates between the storage container and the second arm by holding both ends of the first substrate, the both ends being ends in a second direction intersecting the first direction; and transferring, by the second arm, the first substrate and a second substrate different from the first substrate among the plurality of substrates between the first arm and the boat by holding the first substrate and the second substrate with a first holder, the first holder holding the first substrate and the second substrate in a third direction intersecting the first direction and the second direction, and wherein when the first and second substrates are transferred from the first arm to the second arm:

the first arm holds a first substrate among the plurality of substrates from a back surface side, takes out the first substrate from the storage container, reverses front and back surfaces of the first substrate, and directly transfers the first substrate to the second arm while the front surface of the first substrate faces the second arm, and the first arm holds a second substrate among the plurality of substrates from a front surface side, takes out the second substrate from the storage container, and directly transfers the second substrate to the second arm without reversing front and back surfaces of the second substrate while the back surface of the second substrate faces the second arm.

10. The method according to claim 9, wherein:

the boat includes a plurality of claws arranged at a predetermined interval in the first direction and configured to hold the plurality of substrates, and when the first and second substrates are transferred from the second arm to the boat, the second arm places the first and second substrates superposed in one of the plurality of claws, the first and second substrates having back surfaces facing each other.

11. The method according to claim 9, wherein:

the boat includes a plurality of claws arranged at a predetermined interval in the first direction and configured to hold the plurality of substrates, the second arm includes:

a second holder configured to hold one substrate at both ends in a direction along an extending direction of the second arm; and a third holder configured to hold one substrate at both ends in the direction along the extending direction of the second arm, the third holder being positioned above the second holder, and among the first and second substrates placed on one of the plurality of claws, the third holder holds the second substrate and the second holder holds the first substrate to take out the first and second substrates from the boat.

12. The method according to claim 11, wherein when the first and second substrates are taken out from the boat, the third holder holds the second substrate and then the second holder holds the first substrate.

13. The method according to claim 11, wherein when the first and second substrates are transferred to the storage container:

the first arm receives, from the front surface side, the second substrate held by the third holder among the first and second substrates held by the second arm, and places the second substrate in the storage container, the first arm receiving the second substrate directly from the second arm, and the first arm receives, from the back surface side, the first substrate held by the second holder among the first and second substrates held by the second arm, reverses the front and back surfaces of the first substrate, and places the first substrate in the storage container, the first arm receiving the first substrate directly from the second arm.

14. The method according to claim 9, wherein:

the first arm is configured to hold one substrate at both ends in a direction along an extending direction of the first arm, the first holder of the second arm is configured to hold one substrate at both ends in a direction along an extending direction of the second arm, and the first arm extends in the third direction and the second arm extends in the second direction when one substrate is transferred between the first arm and the second arm, the second direction and the third direction intersecting each other.

15. The method according to claim 14, wherein the second arm is disposed below the first arm when the one substrate is transferred between the first arm and the second arm.

16. The method according to claim 9, wherein the processing performed in the reactor is a process of forming a predetermined layer by atomic layer deposition.

* * * * *